US012591240B2

(12) United States Patent
Iandola et al.

(10) Patent No.: US 12,591,240 B2
(45) Date of Patent: *Mar. 31, 2026

(54) MULTI-CHANNEL SENSOR SIMULATION FOR AUTONOMOUS CONTROL SYSTEMS

(71) Applicant: Tesla, Inc., Palo Alto, CA (US)

(72) Inventors: Forrest Nelson Iandola, San Jose, CA (US); Donald Benton MacMillen, Hillsborough, CA (US); Anting Shen, Berkeley, CA (US); Harsimran Singh Sidhu, Fremont, CA (US); Daniel Paden Tomasello, Los Altos Hills, CA (US); Rohan Nandkumar Phadte, San Jose, CA (US); Paras Jagdish Jain, Cupertino, CA (US)

(73) Assignee: Tesla, Inc., Austin, TX (US)

( * ) Notice: Subject to any disclaimer, the term of this patent is extended or adjusted under 35 U.S.C. 154(b) by 639 days.

This patent is subject to a terminal disclaimer.

(21) Appl. No.: 17/451,965

(22) Filed: Oct. 22, 2021

(65) Prior Publication Data

US 2022/0043449 A1     Feb. 10, 2022

Related U.S. Application Data

(63) Continuation of application No. 15/855,749, filed on Dec. 27, 2017, now Pat. No. 11,157,014.

(Continued)

(51) Int. Cl.
| | |
|---|---|
| *G05D 1/02* | (2020.01) |
| *G05D 1/00* | (2006.01) |

(Continued)

(52) U.S. Cl.
CPC ........... *G05D 1/024* (2013.01); *G05D 1/0246* (2013.01); *G05D 1/0255* (2013.01);
(Continued)

(58) Field of Classification Search
CPC .... G05D 1/024; G05D 1/0246; G05D 1/0255; G05D 1/0257; G06F 30/20; G06F 30/15; G06N 3/045; G06N 3/084; G06N 20/00
See application file for complete search history.

(56) References Cited

U.S. PATENT DOCUMENTS

| | | | |
|---|---|---|---|
| 6,882,755 | B2 | 4/2005 | Silverstein et al. |
| 7,209,031 | B2 | 4/2007 | Nakai et al. |

(Continued)

FOREIGN PATENT DOCUMENTS

| | | |
|---|---|---|
| AU | 2019261735 A1 | 6/2020 |
| AU | 2019201716 A1 | 10/2020 |

(Continued)

OTHER PUBLICATIONS

Joydeep Biswas and Manuela Veloso, "Depth Camera Based Indoor Mobile Robot Localization and Navigation," May 14-18, 2012, 2012 IEEE International Conference on Robotics and Automation, 1697-1702 (Year: 2012).*

(Continued)

*Primary Examiner* — Peter D Nolan
*Assistant Examiner* — Demetra R Smith-Stewart
(74) *Attorney, Agent, or Firm* — Knobbe, Martens, Olson & Bear, LLP

(57)     ABSTRACT

An autonomous control system combines sensor data from multiple sensors to simulate sensor data from high-capacity sensors. The sensor data contains information related to physical environments surrounding vehicles for autonomous guidance. For example, the sensor data may be in the form of images that visually capture scenes of the surrounding environment, geo-location of the vehicles, and the like. The autonomous control system simulates high-capacity sensor data of the physical environment from replacement sensors that may each have lower capacity than high-capacity sen- (Continued)

sors. The high-capacity sensor data may be simulated via one or more neural network models. The autonomous control system performs various detection and control algorithms on the simulated sensor data to guide the vehicle autonomously.

18 Claims, 6 Drawing Sheets

Related U.S. Application Data

(60) Provisional application No. 62/530,788, filed on Jul. 10, 2017, provisional application No. 62/440,289, filed on Dec. 29, 2016.

(51) Int. Cl.

| | |
|---|---|
| *G06F 30/15* | (2020.01) |
| *G06F 30/20* | (2020.01) |
| *G06N 3/04* | (2023.01) |
| *G06N 3/045* | (2023.01) |
| *G06N 3/08* | (2023.01) |
| *G06N 3/084* | (2023.01) |
| G06N 20/00 | (2019.01) |

(52) U.S. Cl.
CPC ........... *G05D 1/0257* (2013.01); *G06F 30/15* (2020.01); *G06F 30/20* (2020.01); *G06N 3/045* (2023.01); *G06N 3/084* (2013.01); *G06N 20/00* (2019.01)

(56) References Cited

U.S. PATENT DOCUMENTS

| | | | |
|---|---|---|---|
| 7,747,070 B2 | 6/2010 | Puri | |
| 7,904,867 B2 | 3/2011 | Burch et al. | |
| 7,974,492 B2 | 7/2011 | Nishijima | |
| 8,165,380 B2 | 4/2012 | Choi et al. | |
| 8,369,633 B2 | 2/2013 | Lu et al. | |
| 8,406,515 B2 | 3/2013 | Cheatle et al. | |
| 8,447,141 B2 * | 5/2013 | Barenbrug | G06T 7/507 |
| | | | 358/463 |
| 8,509,478 B2 | 8/2013 | Haas et al. | |
| 8,588,470 B2 | 11/2013 | Rodriguez et al. | |
| 8,744,174 B2 | 6/2014 | Hamada et al. | |
| 8,773,498 B2 | 7/2014 | Lindbergh | |
| 8,912,476 B2 | 12/2014 | Fogg et al. | |
| 8,913,830 B2 | 12/2014 | Sun et al. | |
| 8,928,753 B2 | 1/2015 | Han et al. | |
| 8,972,095 B2 | 3/2015 | Furuno et al. | |
| 8,976,269 B2 | 3/2015 | Duong | |
| 9,008,422 B2 | 4/2015 | Eid et al. | |
| 9,081,385 B1 | 7/2015 | Ferguson et al. | |
| 9,275,078 B2 * | 3/2016 | Bhardwaj | G06V 20/647 |
| 9,275,289 B2 | 3/2016 | Li et al. | |
| 9,304,156 B2 * | 4/2016 | Weingaertner | B60R 25/2054 |
| 9,586,455 B2 | 3/2017 | Sugai et al. | |
| 9,672,437 B2 | 6/2017 | McCarthy | |
| 9,672,446 B1 * | 6/2017 | Vallespi-Gonzalez | ...................... |
| | | | H04N 13/239 |
| 9,710,696 B2 | 7/2017 | Wang et al. | |
| 9,738,223 B2 | 8/2017 | Zhang et al. | |
| 9,754,154 B2 | 9/2017 | Craig et al. | |
| 9,767,369 B2 | 9/2017 | Furman et al. | |
| 9,965,865 B1 | 5/2018 | Agrawal et al. | |
| 10,133,273 B2 | 11/2018 | Linke | |
| 10,140,252 B2 | 11/2018 | Fowers et al. | |
| 10,140,544 B1 | 11/2018 | Zhao et al. | |
| 10,146,225 B2 | 12/2018 | Ryan | |
| 10,152,655 B2 | 12/2018 | Krishnamurthy et al. | |
| 10,167,800 B1 | 1/2019 | Chung et al. | |
| 10,169,680 B1 | 1/2019 | Sachdeva et al. | |
| 10,192,016 B2 | 1/2019 | Ng et al. | |

| | | |
|---|---|---|
| 10,216,189 B1 | 2/2019 | Haynes |
| 10,228,693 B2 | 3/2019 | Micks et al. |
| 10,242,293 B2 | 3/2019 | Shim et al. |
| 10,248,121 B2 | 4/2019 | VandenBerg, III |
| 10,262,218 B2 | 4/2019 | Lee et al. |
| 10,282,623 B1 | 5/2019 | Ziyaee et al. |
| 10,296,828 B2 | 5/2019 | Viswanathan |
| 10,303,961 B1 | 5/2019 | Stoffel et al. |
| 10,310,087 B2 | 6/2019 | Laddha et al. |
| 10,311,312 B2 | 6/2019 | Yu et al. |
| 10,318,848 B2 | 6/2019 | Dijkman et al. |
| 10,325,178 B1 | 6/2019 | Tang et al. |
| 10,331,974 B2 | 6/2019 | Zia et al. |
| 10,338,600 B2 | 7/2019 | Yoon et al. |
| 10,343,607 B2 | 7/2019 | Kumon et al. |
| 10,359,783 B2 | 7/2019 | Williams et al. |
| 10,366,290 B2 | 7/2019 | Wang et al. |
| 10,372,130 B1 | 8/2019 | Kaushansky et al. |
| 10,373,019 B2 | 8/2019 | Nariyambut Murali et al. |
| 10,373,026 B1 | 8/2019 | Kim et al. |
| 10,380,741 B2 | 8/2019 | Yedla et al. |
| 10,394,237 B2 | 8/2019 | Xu et al. |
| 10,395,144 B2 | 8/2019 | Zeng et al. |
| 10,402,646 B2 | 9/2019 | Klaus |
| 10,402,986 B2 | 9/2019 | Ray et al. |
| 10,414,395 B1 | 9/2019 | Sapp et al. |
| 10,423,934 B1 | 9/2019 | Zanghi et al. |
| 10,436,615 B2 | 10/2019 | Agarwal et al. |
| 10,452,905 B2 | 10/2019 | Segalovitz et al. |
| 10,460,053 B2 | 10/2019 | Olson et al. |
| 10,467,459 B2 | 11/2019 | Chen et al. |
| 10,468,008 B2 | 11/2019 | Beckman et al. |
| 10,468,062 B1 | 11/2019 | Levinson et al. |
| 10,470,510 B1 | 11/2019 | Koh et al. |
| 10,474,160 B2 | 11/2019 | Huang et al. |
| 10,474,161 B2 | 11/2019 | Huang et al. |
| 10,474,928 B2 | 11/2019 | Sivakumar et al. |
| 10,489,126 B2 | 11/2019 | Kumar et al. |
| 10,489,972 B2 | 11/2019 | Atsmon |
| 10,503,971 B1 | 12/2019 | Dang et al. |
| 10,514,711 B2 | 12/2019 | Bar-Nahum et al. |
| 10,528,824 B2 | 1/2020 | Zou |
| 10,529,078 B2 | 1/2020 | Abreu et al. |
| 10,529,088 B2 | 1/2020 | Fine et al. |
| 10,534,854 B2 | 1/2020 | Sharma et al. |
| 10,535,191 B2 | 1/2020 | Sachdeva et al. |
| 10,542,930 B1 | 1/2020 | Sanchez et al. |
| 10,546,197 B2 | 1/2020 | Shrestha et al. |
| 10,546,217 B2 | 1/2020 | Albright et al. |
| 10,552,682 B2 | 2/2020 | Jonsson et al. |
| 10,559,386 B1 | 2/2020 | Neuman |
| 10,565,475 B2 | 2/2020 | Lecue et al. |
| 10,567,674 B2 | 2/2020 | Kirsch |
| 10,568,570 B1 | 2/2020 | Sherpa et al. |
| 10,572,717 B1 | 2/2020 | Zhu et al. |
| 10,574,905 B2 | 2/2020 | Srikanth et al. |
| 10,579,058 B2 | 3/2020 | Oh et al. |
| 10,579,063 B2 | 3/2020 | Haynes et al. |
| 10,579,897 B2 | 3/2020 | Redmon et al. |
| 10,586,280 B2 | 3/2020 | McKenna et al. |
| 10,591,914 B2 | 3/2020 | Palanisamy et al. |
| 10,592,785 B2 | 3/2020 | Zhu et al. |
| 10,599,701 B2 | 3/2020 | Liu |
| 10,599,930 B2 | 3/2020 | Lee et al. |
| 10,599,958 B2 | 3/2020 | He et al. |
| 10,606,990 B2 | 3/2020 | Tuli et al. |
| 10,609,434 B2 | 3/2020 | Singhai et al. |
| 10,614,344 B2 | 4/2020 | Anthony et al. |
| 10,621,513 B2 | 4/2020 | Deshpande et al. |
| 10,627,818 B2 | 4/2020 | Sapp et al. |
| 10,628,432 B2 | 4/2020 | Guo et al. |
| 10,628,686 B2 | 4/2020 | Ogale et al. |
| 10,628,688 B1 | 4/2020 | Kim et al. |
| 10,629,080 B2 | 4/2020 | Kazemi et al. |
| 10,636,161 B2 | 4/2020 | Uchigaito |
| 10,636,169 B2 | 4/2020 | Estrada et al. |
| 10,642,275 B2 | 5/2020 | Silva et al. |
| 10,645,344 B2 | 5/2020 | Marman et al. |
| 10,649,464 B2 | 5/2020 | Gray |

(56) References Cited

U.S. PATENT DOCUMENTS

| | | | |
|---|---|---|---|
| 10,650,071 B2 | 5/2020 | Asgekar et al. |
| 10,652,565 B1 | 5/2020 | Zhang et al. |
| 10,656,657 B2 | 5/2020 | Djuric et al. |
| 10,657,391 B2 | 5/2020 | Chen et al. |
| 10,657,418 B2 | 5/2020 | Marder et al. |
| 10,657,934 B1 | 5/2020 | Kolen et al. |
| 10,661,902 B1 | 5/2020 | Tavshikar |
| 10,664,750 B2 | 5/2020 | Greene |
| 10,671,082 B2 | 6/2020 | Huang et al. |
| 10,671,886 B2 | 6/2020 | Price et al. |
| 10,678,244 B2 | 6/2020 | Iandola et al. |
| 10,678,839 B2 | 6/2020 | Gordon et al. |
| 10,678,997 B2 | 6/2020 | Ahuja et al. |
| 10,679,129 B2 | 6/2020 | Baker |
| 10,685,159 B2 | 6/2020 | Su et al. |
| 10,685,188 B1 | 6/2020 | Zhang et al. |
| 10,692,000 B2 | 6/2020 | Surazhsky et al. |
| 10,692,242 B1 | 6/2020 | Morrison et al. |
| 10,693,740 B2 | 6/2020 | Coccia et al. |
| 10,698,868 B2 | 6/2020 | Guggilla et al. |
| 10,699,119 B2 | 6/2020 | Lo et al. |
| 10,699,140 B2 | 6/2020 | Kench et al. |
| 10,699,477 B2 | 6/2020 | Levinson et al. |
| 10,713,502 B2 | 7/2020 | Tiziani |
| 10,719,759 B2 | 7/2020 | Kutliroff |
| 10,725,475 B2 | 7/2020 | Yang et al. |
| 10,726,264 B2 | 7/2020 | Sawhney et al. |
| 10,726,279 B1 | 7/2020 | Kim et al. |
| 10,726,374 B1 | 7/2020 | Engineer et al. |
| 10,732,261 B1 | 8/2020 | Wang et al. |
| 10,733,262 B2 | 8/2020 | Miller et al. |
| 10,733,482 B1 | 8/2020 | Lee et al. |
| 10,733,638 B1 | 8/2020 | Jain et al. |
| 10,733,755 B2 | 8/2020 | Liao et al. |
| 10,733,876 B2 | 8/2020 | Moura et al. |
| 10,740,563 B2 | 8/2020 | Dugan |
| 10,740,914 B2 | 8/2020 | Xiao et al. |
| 10,748,062 B2 | 8/2020 | Rippel et al. |
| 10,748,247 B2 | 8/2020 | Paluri |
| 10,751,879 B2 | 8/2020 | Li et al. |
| 10,755,112 B2 | 8/2020 | Mabuchi |
| 10,755,575 B2 | 8/2020 | Johnston et al. |
| 10,757,330 B2 | 8/2020 | Ashrafi |
| 10,762,396 B2 | 9/2020 | Vallespi et al. |
| 10,768,628 B2 | 9/2020 | Martin et al. |
| 10,768,629 B2 | 9/2020 | Song et al. |
| 10,769,446 B2 | 9/2020 | Chang et al. |
| 10,769,483 B2 | 9/2020 | Nirenberg et al. |
| 10,769,493 B2 | 9/2020 | Yu et al. |
| 10,769,494 B2 | 9/2020 | Xiao et al. |
| 10,769,525 B2 | 9/2020 | Redding et al. |
| 10,776,626 B1 | 9/2020 | Lin et al. |
| 10,776,673 B2 | 9/2020 | Kim et al. |
| 10,776,939 B2 | 9/2020 | Ma et al. |
| 10,779,760 B2 | 9/2020 | Lee et al. |
| 10,783,381 B2 | 9/2020 | Yu et al. |
| 10,783,454 B2 | 9/2020 | Shoaib et al. |
| 10,789,402 B1 | 9/2020 | Vemuri et al. |
| 10,789,544 B2 | 9/2020 | Fiedel et al. |
| 10,790,919 B1 | 9/2020 | Kolen et al. |
| 10,796,221 B2 | 10/2020 | Zhang et al. |
| 10,796,355 B1 | 10/2020 | Price et al. |
| 10,796,423 B2 | 10/2020 | Goja |
| 10,798,368 B2 | 10/2020 | Briggs et al. |
| 10,803,325 B2 | 10/2020 | Bai et al. |
| 10,803,328 B1 | 10/2020 | Bai et al. |
| 10,803,743 B2 | 10/2020 | Abari et al. |
| 10,805,629 B2 | 10/2020 | Liu et al. |
| 10,809,730 B2 | 10/2020 | Chintakindi |
| 10,810,445 B1 | 10/2020 | Kangaspunta |
| 10,816,346 B2 | 10/2020 | Wheeler et al. |
| 10,816,992 B2 | 10/2020 | Chen |
| 10,817,731 B2 | 10/2020 | Vallespi et al. |
| 10,817,732 B2 | 10/2020 | Porter et al. |
| 10,819,923 B1 | 10/2020 | McCauley et al. |
| 10,824,122 B2 | 11/2020 | Mummadi et al. |
| 10,824,862 B2 | 11/2020 | Qi et al. |
| 10,828,790 B2 | 11/2020 | Nemallan |
| 10,832,057 B2 | 11/2020 | Chan et al. |
| 10,832,093 B1 | 11/2020 | Taralova et al. |
| 10,832,414 B2 | 11/2020 | Pfeiffer |
| 10,832,418 B1 | 11/2020 | Karasev et al. |
| 10,833,785 B1 | 11/2020 | O'Shea et al. |
| 10,836,379 B2 | 11/2020 | Xiao et al. |
| 10,838,936 B2 | 11/2020 | Cohen |
| 10,839,230 B2 | 11/2020 | Charette et al. |
| 10,839,578 B2 | 11/2020 | Coppersmith et al. |
| 10,843,628 B2 | 11/2020 | Kawamoto et al. |
| 10,845,820 B2 | 11/2020 | Wheeler |
| 10,845,943 B1 | 11/2020 | Ansari et al. |
| 10,846,831 B2 | 11/2020 | Raduta |
| 10,846,888 B2 | 11/2020 | Kaplanyan et al. |
| 10,853,670 B2 | 12/2020 | Sholingar et al. |
| 10,853,739 B2 | 12/2020 | Truong et al. |
| 10,860,919 B2 | 12/2020 | Kanazawa et al. |
| 10,860,924 B2 | 12/2020 | Burger |
| 10,867,444 B2 | 12/2020 | Russell et al. |
| 10,871,444 B2 | 12/2020 | Al et al. |
| 10,871,782 B2 | 12/2020 | Milstein et al. |
| 10,872,204 B2 | 12/2020 | Zhu et al. |
| 10,872,254 B2 | 12/2020 | Mangla et al. |
| 10,872,326 B2 | 12/2020 | Garner |
| 10,872,531 B2 | 12/2020 | Liu et al. |
| 10,885,083 B2 | 1/2021 | Moeller-Bertram et al. |
| 10,887,433 B2 | 1/2021 | Fu et al. |
| 10,890,898 B2 | 1/2021 | Akella et al. |
| 10,891,715 B2 | 1/2021 | Li |
| 10,891,735 B2 | 1/2021 | Yang et al. |
| 10,893,070 B2 | 1/2021 | Wang et al. |
| 10,893,107 B1 | 1/2021 | Callari et al. |
| 10,896,763 B2 | 1/2021 | Kempanna et al. |
| 10,901,416 B2 | 1/2021 | Khanna et al. |
| 10,901,508 B2 | 1/2021 | Laszlo et al. |
| 10,902,551 B1 | 1/2021 | Mellado et al. |
| 10,908,068 B2 | 2/2021 | Amer et al. |
| 10,908,606 B2 | 2/2021 | Stein et al. |
| 10,909,368 B2 | 2/2021 | Guo et al. |
| 10,909,453 B1 | 2/2021 | Myers et al. |
| 10,915,783 B1 | 2/2021 | Hallman et al. |
| 10,917,522 B2 | 2/2021 | Segalis et al. |
| 10,921,817 B1 | 2/2021 | Kangaspunta |
| 10,922,578 B2 | 2/2021 | Banerjee et al. |
| 10,924,661 B2 | 2/2021 | Vasconcelos et al. |
| 10,928,508 B2 | 2/2021 | Swaminathan |
| 10,929,757 B2 | 2/2021 | Baker et al. |
| 10,930,065 B2 | 2/2021 | Grant et al. |
| 10,936,908 B1 | 3/2021 | Ho et al. |
| 10,937,186 B2 | 3/2021 | Wang et al. |
| 10,943,101 B2 | 3/2021 | Agarwal et al. |
| 10,943,132 B2 | 3/2021 | Wang et al. |
| 10,943,355 B2 | 3/2021 | Fagg et al. |
| 11,157,014 B2 | 10/2021 | Iandola et al. |
| 2003/0035481 A1 | 2/2003 | Hahm |
| 2003/0146869 A1 | 8/2003 | Lin et al. |
| 2005/0162445 A1 | 7/2005 | Sheasby et al. |
| 2006/0072847 A1 | 4/2006 | Chor et al. |
| 2006/0224533 A1 | 10/2006 | Thaler |
| 2006/0280364 A1 | 12/2006 | Ma et al. |
| 2007/0280528 A1 | 12/2007 | Wellington et al. |
| 2009/0016571 A1 | 1/2009 | Tijerina et al. |
| 2010/0106356 A1 | 4/2010 | Trepagnier et al. |
| 2010/0118157 A1 | 5/2010 | Kameyama |
| 2012/0083959 A1 | 4/2012 | Dolgov |
| 2012/0101680 A1* | 4/2012 | Trepagnier ............... G01S 17/86 |
| | | 701/25 |
| 2012/0109915 A1 | 5/2012 | Kamekawa |
| 2012/0110491 A1 | 5/2012 | Cheung |
| 2012/0134595 A1 | 5/2012 | Fonseca et al. |
| 2015/0063681 A1* | 3/2015 | Bhardwaj ........... G06F 16/5838 |
| | | 382/154 |
| 2015/0104102 A1 | 4/2015 | Carreira et al. |
| 2015/0206015 A1* | 7/2015 | Ramalingam ......... G06F 18/217 |
| | | 382/104 |
| 2015/0317284 A1 | 11/2015 | Takahashi |

(56) References Cited

U.S. PATENT DOCUMENTS

| | | | |
|---|---|---|---|
| 2015/0324636 A1* | 11/2015 | Bentley | A63F 13/212 |
| | | | 386/227 |
| 2016/0132786 A1 | 5/2016 | Balan et al. | |
| 2016/0210382 A1 | 7/2016 | Alaniz et al. | |
| 2016/0210775 A1 | 7/2016 | Alaniz et al. | |
| 2016/0314224 A1 | 10/2016 | Wei et al. | |
| 2016/0328856 A1 | 11/2016 | Mannino et al. | |
| 2016/0335795 A1* | 11/2016 | Flynn | G06V 10/764 |
| 2017/0011281 A1 | 1/2017 | Dihkman et al. | |
| 2017/0109928 A1 | 4/2017 | Micks | |
| 2017/0123428 A1 | 5/2017 | Levinson et al. | |
| 2017/0158134 A1 | 6/2017 | Shigemura | |
| 2017/0206434 A1 | 7/2017 | Nariyambut et al. | |
| 2017/0213149 A1 | 7/2017 | Micks | |
| 2017/0364776 A1 | 12/2017 | Micks | |
| 2018/0012411 A1 | 1/2018 | Richey et al. | |
| 2018/0018590 A1 | 1/2018 | Szeto et al. | |
| 2018/0039853 A1 | 2/2018 | Liu et al. | |
| 2018/0060725 A1* | 3/2018 | Groh | G06N 3/045 |
| 2018/0067489 A1 | 3/2018 | Oder et al. | |
| 2018/0068459 A1 | 3/2018 | Zhang et al. | |
| 2018/0068540 A1 | 3/2018 | Romanenko et al. | |
| 2018/0074506 A1 | 3/2018 | Branson | |
| 2018/0121762 A1 | 5/2018 | Han et al. | |
| 2018/0150081 A1 | 5/2018 | Gross et al. | |
| 2018/0211403 A1 | 7/2018 | Hotson et al. | |
| 2018/0308012 A1 | 10/2018 | Mummadi et al. | |
| 2018/0314878 A1 | 11/2018 | Lee et al. | |
| 2018/0357511 A1 | 12/2018 | Misra et al. | |
| 2018/0374105 A1 | 12/2018 | Azout et al. | |
| 2019/0023277 A1 | 1/2019 | Roger et al. | |
| 2019/0025773 A1 | 1/2019 | Yang et al. | |
| 2019/0042894 A1 | 2/2019 | Anderson | |
| 2019/0042919 A1 | 2/2019 | Peysakhovich et al. | |
| 2019/0042944 A1 | 2/2019 | Nair et al. | |
| 2019/0042948 A1 | 2/2019 | Lee et al. | |
| 2019/0057314 A1 | 2/2019 | Julian et al. | |
| 2019/0065637 A1 | 2/2019 | Bogdoll et al. | |
| 2019/0072978 A1 | 3/2019 | Levi | |
| 2019/0079526 A1 | 3/2019 | Vallespi et al. | |
| 2019/0080602 A1 | 3/2019 | Rice et al. | |
| 2019/0095780 A1 | 3/2019 | Zhong et al. | |
| 2019/0095946 A1 | 3/2019 | Azout et al. | |
| 2019/0101914 A1 | 4/2019 | Coleman et al. | |
| 2019/0108417 A1 | 4/2019 | Talagala et al. | |
| 2019/0122111 A1 | 4/2019 | Min et al. | |
| 2019/0130255 A1 | 5/2019 | Yim et al. | |
| 2019/0145765 A1 | 5/2019 | Luo et al. | |
| 2019/0146497 A1 | 5/2019 | Urtasun et al. | |
| 2019/0147112 A1 | 5/2019 | Gordon | |
| 2019/0147250 A1 | 5/2019 | Zhang et al. | |
| 2019/0147254 A1 | 5/2019 | Bai et al. | |
| 2019/0147255 A1 | 5/2019 | Homayounfar et al. | |
| 2019/0147335 A1 | 5/2019 | Wang et al. | |
| 2019/0147372 A1 | 5/2019 | Luo et al. | |
| 2019/0158784 A1 | 5/2019 | Ahn et al. | |
| 2019/0180154 A1 | 6/2019 | Orlov et al. | |
| 2019/0185010 A1 | 6/2019 | Ganguli et al. | |
| 2019/0189251 A1 | 6/2019 | Horiuchi et al. | |
| 2019/0197357 A1 | 6/2019 | Anderson et al. | |
| 2019/0204842 A1 | 7/2019 | Jafari et al. | |
| 2019/0205402 A1 | 7/2019 | Sernau et al. | |
| 2019/0205667 A1 | 7/2019 | Avidan et al. | |
| 2019/0217791 A1 | 7/2019 | Bradley et al. | |
| 2019/0227562 A1 | 7/2019 | Mohammadiha et al. | |
| 2019/0228037 A1 | 7/2019 | Nicol et al. | |
| 2019/0230282 A1 | 7/2019 | Sypitkowski et al. | |
| 2019/0235499 A1 | 8/2019 | Kazemi et al. | |
| 2019/0236437 A1 | 8/2019 | Shin et al. | |
| 2019/0243371 A1 | 8/2019 | Nister et al. | |
| 2019/0244138 A1 | 8/2019 | Bhowmick et al. | |
| 2019/0250622 A1 | 8/2019 | Nister et al. | |
| 2019/0250626 A1 | 8/2019 | Ghafarianzadeh et al. | |
| 2019/0250640 A1 | 8/2019 | O'Flaherty et al. | |
| 2019/0258878 A1 | 8/2019 | Koivisto et al. | |
| 2019/0266418 A1 | 8/2019 | Xu et al. | |
| 2019/0266610 A1 | 8/2019 | Ghatage et al. | |
| 2019/0272446 A1 | 9/2019 | Kangaspunta et al. | |
| 2019/0276041 A1 | 9/2019 | Choi et al. | |
| 2019/0279004 A1 | 9/2019 | Kwon et al. | |
| 2019/0286652 A1 | 9/2019 | Habbecke et al. | |
| 2019/0286972 A1 | 9/2019 | El Husseini et al. | |
| 2019/0287028 A1 | 9/2019 | St Amant et al. | |
| 2019/0289281 A1 | 9/2019 | Badrinarayanan et al. | |
| 2019/0294177 A1 | 9/2019 | Kwon et al. | |
| 2019/0294975 A1 | 9/2019 | Sachs | |
| 2019/0311290 A1 | 10/2019 | Huang et al. | |
| 2019/0318099 A1 | 10/2019 | Carvalho et al. | |
| 2019/0325088 A1 | 10/2019 | Dubey et al. | |
| 2019/0325266 A1 | 10/2019 | Klepper et al. | |
| 2019/0325269 A1 | 10/2019 | Bagherinezhad et al. | |
| 2019/0325580 A1 | 10/2019 | Lukac et al. | |
| 2019/0325595 A1 | 10/2019 | Stein et al. | |
| 2019/0329790 A1 | 10/2019 | Nandakumar et al. | |
| 2019/0332875 A1 | 10/2019 | Vallespi-Gonzalez et al. | |
| 2019/0333232 A1 | 10/2019 | Vallespi-Gonzalez et al. | |
| 2019/0336063 A1 | 11/2019 | Dascalu | |
| 2019/0339989 A1 | 11/2019 | Liang et al. | |
| 2019/0340462 A1 | 11/2019 | Pao et al. | |
| 2019/0340492 A1 | 11/2019 | Burger et al. | |
| 2019/0340499 A1 | 11/2019 | Burger et al. | |
| 2019/0347501 A1 | 11/2019 | Kim et al. | |
| 2019/0349571 A1 | 11/2019 | Herman et al. | |
| 2019/0354782 A1 | 11/2019 | Kee et al. | |
| 2019/0354786 A1 | 11/2019 | Lee et al. | |
| 2019/0354808 A1 | 11/2019 | Park et al. | |
| 2019/0354817 A1 | 11/2019 | Shlens et al. | |
| 2019/0354850 A1 | 11/2019 | Watson et al. | |
| 2019/0370398 A1 | 12/2019 | He et al. | |
| 2019/0370575 A1 | 12/2019 | Nandakumar et al. | |
| 2019/0370935 A1 | 12/2019 | Chang et al. | |
| 2019/0373322 A1 | 12/2019 | Rojas-Echenique et al. | |
| 2019/0377345 A1 | 12/2019 | Bachrach et al. | |
| 2019/0377965 A1 | 12/2019 | Totolos et al. | |
| 2019/0378049 A1 | 12/2019 | Widmann et al. | |
| 2019/0378051 A1 | 12/2019 | Widmann et al. | |
| 2019/0382007 A1 | 12/2019 | Casas et al. | |
| 2019/0384303 A1 | 12/2019 | Muller et al. | |
| 2019/0384304 A1 | 12/2019 | Towal et al. | |
| 2019/0384309 A1 | 12/2019 | Silva et al. | |
| 2019/0384994 A1 | 12/2019 | Frossard et al. | |
| 2019/0385048 A1 | 12/2019 | Cassidy et al. | |
| 2019/0385360 A1 | 12/2019 | Yang et al. | |
| 2020/0004259 A1 | 1/2020 | Gulino et al. | |
| 2020/0004351 A1 | 1/2020 | Marchant et al. | |
| 2020/0012936 A1 | 1/2020 | Lee et al. | |
| 2020/0017117 A1 | 1/2020 | Milton | |
| 2020/0025931 A1 | 1/2020 | Liang et al. | |
| 2020/0026282 A1 | 1/2020 | Choe et al. | |
| 2020/0026283 A1 | 1/2020 | Barnes et al. | |
| 2020/0026992 A1 | 1/2020 | Zhang et al. | |
| 2020/0027210 A1 | 1/2020 | Haemel et al. | |
| 2020/0033858 A1 | 1/2020 | Xiao | |
| 2020/0033865 A1 | 1/2020 | Mellinger et al. | |
| 2020/0034665 A1 | 1/2020 | Ghanta et al. | |
| 2020/0034710 A1 | 1/2020 | Sidhu et al. | |
| 2020/0036948 A1 | 1/2020 | Song | |
| 2020/0039520 A1 | 2/2020 | Misu et al. | |
| 2020/0051550 A1 | 2/2020 | Baker | |
| 2020/0060757 A1 | 2/2020 | Ben-Haim et al. | |
| 2020/0065711 A1 | 2/2020 | Clément et al. | |
| 2020/0065879 A1 | 2/2020 | Hu et al. | |
| 2020/0069973 A1 | 3/2020 | Lou et al. | |
| 2020/0073385 A1 | 3/2020 | Jobanputra et al. | |
| 2020/0074230 A1 | 3/2020 | Englard et al. | |
| 2020/0086880 A1 | 3/2020 | Poeppel et al. | |
| 2020/0089243 A1 | 3/2020 | Poeppel et al. | |
| 2020/0089969 A1 | 3/2020 | Lakshmi et al. | |
| 2020/0090056 A1 | 3/2020 | Singhal et al. | |
| 2020/0097841 A1 | 3/2020 | Petousis et al. | |
| 2020/0098095 A1 | 3/2020 | Borcs et al. | |
| 2020/0103894 A1 | 4/2020 | Cella et al. | |
| 2020/0104705 A1 | 4/2020 | Bhowmick et al. | |
| 2020/0110416 A1 | 4/2020 | Hong et al. | |

(56) References Cited

U.S. PATENT DOCUMENTS

| | | |
|---|---|---|
| 2020/0117180 A1 | 4/2020 | Cella et al. |
| 2020/0117889 A1 | 4/2020 | Laput et al. |
| 2020/0117916 A1 | 4/2020 | Liu |
| 2020/0117917 A1 | 4/2020 | Yoo |
| 2020/0118035 A1 | 4/2020 | Asawa et al. |
| 2020/0125844 A1 | 4/2020 | She et al. |
| 2020/0125845 A1 | 4/2020 | Hess et al. |
| 2020/0126129 A1 | 4/2020 | Lkhamsuren et al. |
| 2020/0134427 A1 | 4/2020 | Oh et al. |
| 2020/0134461 A1 | 4/2020 | Chai et al. |
| 2020/0134466 A1 | 4/2020 | Weintraub et al. |
| 2020/0134848 A1 | 4/2020 | El-Khamy et al. |
| 2020/0143231 A1 | 5/2020 | Fusi et al. |
| 2020/0143279 A1 | 5/2020 | West et al. |
| 2020/0148201 A1 | 5/2020 | King et al. |
| 2020/0149898 A1 | 5/2020 | Felip et al. |
| 2020/0151201 A1 | 5/2020 | Chandrasekhar et al. |
| 2020/0151619 A1 | 5/2020 | Mopur et al. |
| 2020/0151692 A1 | 5/2020 | Gao et al. |
| 2020/0158822 A1 | 5/2020 | Owens et al. |
| 2020/0158869 A1 | 5/2020 | Amirloo et al. |
| 2020/0159225 A1 | 5/2020 | Zeng et al. |
| 2020/0160064 A1 | 5/2020 | Wang et al. |
| 2020/0160104 A1 | 5/2020 | Urtasun et al. |
| 2020/0160117 A1 | 5/2020 | Urtasun et al. |
| 2020/0160178 A1 | 5/2020 | Kar et al. |
| 2020/0160532 A1 | 5/2020 | Urtasun et al. |
| 2020/0160558 A1 | 5/2020 | Urtasun et al. |
| 2020/0160559 A1 | 5/2020 | Urtasun et al. |
| 2020/0160598 A1 | 5/2020 | Manivasagam et al. |
| 2020/0162489 A1 | 5/2020 | Bar-Nahum et al. |
| 2020/0167438 A1 | 5/2020 | Herring |
| 2020/0167554 A1 | 5/2020 | Wang et al. |
| 2020/0174481 A1 | 6/2020 | Van Heukelom et al. |
| 2020/0175326 A1 | 6/2020 | Shen et al. |
| 2020/0175354 A1 | 6/2020 | Volodarskiy et al. |
| 2020/0175371 A1 | 6/2020 | Kursun |
| 2020/0175401 A1 | 6/2020 | Shen |
| 2020/0183482 A1 | 6/2020 | Sebot et al. |
| 2020/0184250 A1 | 6/2020 | Oko |
| 2020/0184333 A1 | 6/2020 | Oh |
| 2020/0192389 A1 | 6/2020 | ReMine et al. |
| 2020/0193313 A1 | 6/2020 | Ghanta et al. |
| 2020/0193328 A1 | 6/2020 | Guestrin et al. |
| 2020/0202136 A1 | 6/2020 | Shrestha et al. |
| 2020/0202196 A1 | 6/2020 | Guo et al. |
| 2020/0209857 A1 | 7/2020 | Djuric et al. |
| 2020/0209867 A1 | 7/2020 | Valois et al. |
| 2020/0209874 A1 | 7/2020 | Chen et al. |
| 2020/0210717 A1 | 7/2020 | Hou et al. |
| 2020/0210769 A1 | 7/2020 | Hou et al. |
| 2020/0210777 A1 | 7/2020 | Valois et al. |
| 2020/0216064 A1 | 7/2020 | du Toit et al. |
| 2020/0218722 A1 | 7/2020 | Mai et al. |
| 2020/0218979 A1 | 7/2020 | Kwon et al. |
| 2020/0223434 A1 | 7/2020 | Campos et al. |
| 2020/0225758 A1 | 7/2020 | Tang et al. |
| 2020/0226377 A1 | 7/2020 | Campos et al. |
| 2020/0226430 A1 | 7/2020 | Ahuja et al. |
| 2020/0238998 A1 | 7/2020 | Dasalukunte et al. |
| 2020/0242381 A1 | 7/2020 | Chao et al. |
| 2020/0242408 A1 | 7/2020 | Kim et al. |
| 2020/0242511 A1 | 7/2020 | Kale et al. |
| 2020/0245869 A1 | 8/2020 | Sivan et al. |
| 2020/0249685 A1 | 8/2020 | Elluswamy et al. |
| 2020/0250456 A1 | 8/2020 | Wang et al. |
| 2020/0250515 A1 | 8/2020 | Rifkin et al. |
| 2020/0250874 A1 | 8/2020 | Assouline et al. |
| 2020/0257301 A1 | 8/2020 | Weiser et al. |
| 2020/0257306 A1 | 8/2020 | Nisenzon |
| 2020/0258057 A1 | 8/2020 | Farahat et al. |
| 2020/0265247 A1 | 8/2020 | Musk et al. |
| 2020/0272160 A1 | 8/2020 | Djuric et al. |
| 2020/0272162 A1 | 8/2020 | Hasselgren et al. |
| 2020/0272859 A1 | 8/2020 | Iashyn et al. |
| 2020/0273231 A1 | 8/2020 | Schied et al. |
| 2020/0279354 A1 | 9/2020 | Klaiman |
| 2020/0279364 A1 | 9/2020 | Sarkisian et al. |
| 2020/0279371 A1 | 9/2020 | Wenzel et al. |
| 2020/0285464 A1 | 9/2020 | Brebner |
| 2020/0286256 A1 | 9/2020 | Houts et al. |
| 2020/0293786 A1 | 9/2020 | Jia et al. |
| 2020/0293796 A1 | 9/2020 | Sajjadi et al. |
| 2020/0293828 A1 | 9/2020 | Wang et al. |
| 2020/0293905 A1 | 9/2020 | Huang et al. |
| 2020/0294162 A1 | 9/2020 | Shah |
| 2020/0294257 A1 | 9/2020 | Yoo et al. |
| 2020/0294310 A1 | 9/2020 | Lee et al. |
| 2020/0297237 A1 | 9/2020 | Tamersoy et al. |
| 2020/0298891 A1 | 9/2020 | Liang et al. |
| 2020/0301799 A1 | 9/2020 | Manivasagam et al. |
| 2020/0302276 A1 | 9/2020 | Yang et al. |
| 2020/0302291 A1 | 9/2020 | Hong |
| 2020/0302627 A1 | 9/2020 | Duggal et al. |
| 2020/0302662 A1 | 9/2020 | Homayounfar et al. |
| 2020/0304441 A1 | 9/2020 | Bradley et al. |
| 2020/0306640 A1 | 10/2020 | Kolen et al. |
| 2020/0307562 A1 | 10/2020 | Ghafarianzadeh et al. |
| 2020/0307563 A1 | 10/2020 | Ghafarianzadeh et al. |
| 2020/0309536 A1 | 10/2020 | Omari et al. |
| 2020/0309923 A1 | 10/2020 | Bhaskaran et al. |
| 2020/0310442 A1 | 10/2020 | Halder et al. |
| 2020/0311601 A1 | 10/2020 | Robinson et al. |
| 2020/0312003 A1 | 10/2020 | Borovikov et al. |
| 2020/0315708 A1 | 10/2020 | Mosnier et al. |
| 2020/0320132 A1 | 10/2020 | Neumann |
| 2020/0324073 A1 | 10/2020 | Rajan et al. |
| 2020/0327192 A1 | 10/2020 | Hackman et al. |
| 2020/0327443 A1 | 10/2020 | Van et al. |
| 2020/0327449 A1 | 10/2020 | Tiwari et al. |
| 2020/0327662 A1 | 10/2020 | Liu et al. |
| 2020/0327667 A1 | 10/2020 | Arbel et al. |
| 2020/0331476 A1 | 10/2020 | Chen et al. |
| 2020/0334416 A1 | 10/2020 | Vianu et al. |
| 2020/0334495 A1 | 10/2020 | Al et al. |
| 2020/0334501 A1 | 10/2020 | Lin et al. |
| 2020/0334551 A1 | 10/2020 | Javidi et al. |
| 2020/0334574 A1 | 10/2020 | Ishida |
| 2020/0337648 A1 | 10/2020 | Saripalli et al. |
| 2020/0341466 A1 | 10/2020 | Pham et al. |
| 2020/0342350 A1 | 10/2020 | Madar et al. |
| 2020/0342548 A1 | 10/2020 | Mazed et al. |
| 2020/0342652 A1 | 10/2020 | Rowell et al. |
| 2020/0348909 A1 | 11/2020 | Das Sarma et al. |
| 2020/0350063 A1 | 11/2020 | Thornton et al. |
| 2020/0351438 A1 | 11/2020 | Dewhurst et al. |
| 2020/0356107 A1 | 11/2020 | Wells |
| 2020/0356790 A1 | 11/2020 | Jaipuria et al. |
| 2020/0356864 A1 | 11/2020 | Neumann |
| 2020/0356905 A1 | 11/2020 | Luk et al. |
| 2020/0361083 A1 | 11/2020 | Mousavian et al. |
| 2020/0361485 A1 | 11/2020 | Zhu et al. |
| 2020/0364481 A1 | 11/2020 | Kornienko et al. |
| 2020/0364508 A1 | 11/2020 | Gurel et al. |
| 2020/0364540 A1 | 11/2020 | Elsayed et al. |
| 2020/0364746 A1 | 11/2020 | Longano et al. |
| 2020/0364953 A1 | 11/2020 | Simoudis |
| 2020/0372362 A1 | 11/2020 | Kim |
| 2020/0372402 A1 | 11/2020 | Kursun et al. |
| 2020/0380362 A1 | 12/2020 | Cao et al. |
| 2020/0380383 A1 | 12/2020 | Kwong et al. |
| 2020/0393841 A1 | 12/2020 | Frisbie et al. |
| 2020/0394421 A1 | 12/2020 | Yu et al. |
| 2020/0394457 A1 | 12/2020 | Brady |
| 2020/0394495 A1 | 12/2020 | Moudgill et al. |
| 2020/0394813 A1 | 12/2020 | Theverapperuma et al. |
| 2020/0396394 A1 | 12/2020 | Zlokolica et al. |
| 2020/0398855 A1 | 12/2020 | Thompson |
| 2020/0401850 A1 | 12/2020 | Bazarsky et al. |
| 2020/0401886 A1 | 12/2020 | Deng et al. |
| 2020/0402155 A1 | 12/2020 | Kurian et al. |
| 2020/0402226 A1 | 12/2020 | Peng |
| 2020/0410012 A1 | 12/2020 | Moon et al. |
| 2020/0410224 A1 | 12/2020 | Goel |

(56) References Cited

U.S. PATENT DOCUMENTS

| | | | |
|---|---|---|---|
| 2020/0410254 A1 | 12/2020 | Pham et al. |
| 2020/0410288 A1 | 12/2020 | Capota et al. |
| 2020/0410751 A1 | 12/2020 | Omari et al. |
| 2021/0004014 A1 | 1/2021 | Sivakumar |
| 2021/0004580 A1 | 1/2021 | Sundararaman et al. |
| 2021/0004611 A1 | 1/2021 | Garimella et al. |
| 2021/0004663 A1 | 1/2021 | Park et al. |
| 2021/0006835 A1 | 1/2021 | Slattery et al. |
| 2021/0011908 A1 | 1/2021 | Hayes et al. |
| 2021/0012116 A1 | 1/2021 | Urtasun et al. |
| 2021/0012210 A1 | 1/2021 | Sikka et al. |
| 2021/0012230 A1 | 1/2021 | Hayes et al. |
| 2021/0012239 A1 | 1/2021 | Arzani et al. |
| 2021/0015240 A1 | 1/2021 | Elfakhri et al. |
| 2021/0019215 A1 | 1/2021 | Neeter |
| 2021/0026360 A1 | 1/2021 | Luo |
| 2021/0027112 A1 | 1/2021 | Brewington et al. |
| 2021/0027117 A1 | 1/2021 | McGavran et al. |
| 2021/0030276 A1 | 2/2021 | Li et al. |
| 2021/0034921 A1 | 2/2021 | Pinkovich et al. |
| 2021/0042575 A1 | 2/2021 | Firner |
| 2021/0042928 A1 | 2/2021 | Takeda et al. |
| 2021/0046954 A1 | 2/2021 | Haynes |
| 2021/0049378 A1 | 2/2021 | Gautam et al. |
| 2021/0049455 A1 | 2/2021 | Kursun |
| 2021/0049456 A1 | 2/2021 | Kursun |
| 2021/0049548 A1 | 2/2021 | Grisz et al. |
| 2021/0049700 A1 | 2/2021 | Nguyen et al. |
| 2021/0056114 A1 | 2/2021 | Price et al. |
| 2021/0056306 A1 | 2/2021 | Hu et al. |
| 2021/0056317 A1 | 2/2021 | Golov |
| 2021/0056420 A1 | 2/2021 | Konishi et al. |
| 2021/0056701 A1 | 2/2021 | Vranceanu et al. |

FOREIGN PATENT DOCUMENTS

| | | | |
|---|---|---|---|
| CN | 110599537 A | 12/2010 |
| CN | 102737236 A | 10/2012 |
| CN | 103366339 A | 10/2013 |
| CN | 104835114 A | 8/2015 |
| CN | 103236037 B | 5/2016 |
| CN | 103500322 B | 8/2016 |
| CN | 106419893 A | 2/2017 |
| CN | 106504253 A | 3/2017 |
| CN | 107031600 A | 8/2017 |
| CN | 107169421 A | 9/2017 |
| CN | 107507134 A | 12/2017 |
| CN | 107885214 A | 4/2018 |
| CN | 108122234 A | 6/2018 |
| CN | 107133943 B | 7/2018 |
| CN | 107368926 B | 7/2018 |
| CN | 105318888 B | 8/2018 |
| CN | 108491889 A | 9/2018 |
| CN | 108647591 A | 10/2018 |
| CN | 108710865 A | 10/2018 |
| CN | 105550701 B | 11/2018 |
| CN | 108764185 A | 11/2018 |
| CN | 108845574 A | 11/2018 |
| CN | 108898177 A | 11/2018 |
| CN | 109086867 A | 12/2018 |
| CN | 107103113 B | 1/2019 |
| CN | 109215067 A | 1/2019 |
| CN | 109359731 A | 2/2019 |
| CN | 109389207 A | 2/2019 |
| CN | 109389552 A | 2/2019 |
| CN | 106779060 B | 3/2019 |
| CN | 109579856 A | 4/2019 |
| CN | 109615073 A | 4/2019 |
| CN | 106156754 B | 5/2019 |
| CN | 106598226 B | 5/2019 |
| CN | 106650922 B | 5/2019 |
| CN | 109791626 A | 5/2019 |
| CN | 109901595 A | 6/2019 |
| CN | 109902732 A | 6/2019 |
| CN | 109934163 A | 6/2019 |
| CN | 109948428 A | 6/2019 |
| CN | 109949257 A | 6/2019 |
| CN | 109951710 A | 6/2019 |
| CN | 109975308 A | 7/2019 |
| CN | 109978132 A | 7/2019 |
| CN | 109978161 A | 7/2019 |
| CN | 110060202 A | 7/2019 |
| CN | 110069071 A | 7/2019 |
| CN | 110084086 A | 8/2019 |
| CN | 110096937 A | 8/2019 |
| CN | 110111340 A | 8/2019 |
| CN | 110135485 A | 8/2019 |
| CN | 110197270 B | 9/2019 |
| CN | 110310264 A | 10/2019 |
| CN | 110321965 A | 10/2019 |
| CN | 110334801 A | 10/2019 |
| CN | 110399875 A | 11/2019 |
| CN | 110414362 A | 11/2019 |
| CN | 110426051 A | 11/2019 |
| CN | 110473173 A | 11/2019 |
| CN | 110516665 A | 11/2019 |
| CN | 110543837 A | 12/2019 |
| CN | 110569899 A | 12/2019 |
| CN | 110599864 A | 12/2019 |
| CN | 110619282 A | 12/2019 |
| CN | 110619283 A | 12/2019 |
| CN | 110619330 A | 12/2019 |
| CN | 110659628 A | 1/2020 |
| CN | 110688992 A | 1/2020 |
| CN | 107742311 B | 2/2020 |
| CN | 110751280 A | 2/2020 |
| CN | 110826566 A | 2/2020 |
| CN | 107451659 B | 4/2020 |
| CN | 108111873 B | 4/2020 |
| CN | 110956185 A | 4/2020 |
| CN | 110966991 A | 4/2020 |
| CN | 111027549 A | 4/2020 |
| CN | 111027575 A | 4/2020 |
| CN | 111047225 A | 4/2020 |
| CN | 111126453 A | 5/2020 |
| CN | 111158355 A | 5/2020 |
| CN | 107729998 B | 6/2020 |
| CN | 108549934 B | 6/2020 |
| CN | 111275129 A | 6/2020 |
| CN | 111275618 A | 6/2020 |
| CN | 111326023 A | 6/2020 |
| CN | 111428943 A | 7/2020 |
| CN | 111444821 A | 7/2020 |
| CN | 111445420 A | 7/2020 |
| CN | 111461052 A | 7/2020 |
| CN | 111461053 A | 7/2020 |
| CN | 111461110 A | 7/2020 |
| CN | 110225341 B | 8/2020 |
| CN | 111307162 B | 8/2020 |
| CN | 111488770 A | 8/2020 |
| CN | 111539514 A | 8/2020 |
| CN | 111565318 A | 8/2020 |
| CN | 111582216 A | 8/2020 |
| CN | 111598095 A | 8/2020 |
| CN | 108229526 B | 9/2020 |
| CN | 111693972 A | 9/2020 |
| CN | 106558058 B | 10/2020 |
| CN | 107169560 B | 10/2020 |
| CN | 107622258 B | 10/2020 |
| CN | 111767801 A | 10/2020 |
| CN | 111768002 A | 10/2020 |
| CN | 111783545 A | 10/2020 |
| CN | 111783971 A | 10/2020 |
| CN | 111797657 A | 10/2020 |
| CN | 111814623 A | 10/2020 |
| CN | 111814902 A | 10/2020 |
| CN | 111860499 A | 10/2020 |
| CN | 111881856 A | 11/2020 |
| CN | 111882579 A | 11/2020 |
| CN | 111897639 A | 11/2020 |
| CN | 111898507 A | 11/2020 |
| CN | 111898523 A | 11/2020 |
| CN | 111899227 A | 11/2020 |
| CN | 112101175 A | 12/2020 |

(56)  References Cited

FOREIGN PATENT DOCUMENTS

| CN | 112101562 A | 12/2020 |
| CN | 112115953 A | 12/2020 |
| CN | 111062973 B | 1/2021 |
| CN | 111275080 B | 1/2021 |
| CN | 112183739 A | 1/2021 |
| CN | 112232497 A | 1/2021 |
| CN | 112288658 A | 1/2021 |
| CN | 112308095 A | 2/2021 |
| CN | 112308799 A | 2/2021 |
| CN | 112313663 A | 2/2021 |
| CN | 112329552 A | 2/2021 |
| CN | 112348783 A | 2/2021 |
| CN | 111899245 B | 3/2021 |
| DE | 202017102235 U1 | 5/2017 |
| DE | 202017102238 U1 | 5/2017 |
| DE | 102017116017 A1 | 1/2019 |
| DE | 102018130821 A1 | 6/2020 |
| DE | 102019008316 A1 | 8/2020 |
| EP | 1215626 B1 | 9/2008 |
| EP | 2228666 B1 | 9/2012 |
| EP | 2420408 B1 | 5/2013 |
| EP | 2723069 A1 | 4/2014 |
| EP | 2741253 A1 | 6/2014 |
| EP | 3115772 A1 | 1/2017 |
| EP | 2618559 B1 | 8/2017 |
| EP | 3285485 A1 | 2/2018 |
| EP | 2863633 B1 | 2/2019 |
| EP | 3113080 B1 | 5/2019 |
| EP | 3525132 A1 | 8/2019 |
| EP | 3531689 A1 | 8/2019 |
| EP | 3537340 A1 | 9/2019 |
| EP | 3543917 A1 | 9/2019 |
| EP | 3608840 A1 | 2/2020 |
| EP | 3657387 A1 | 5/2020 |
| EP | 2396750 B1 | 6/2020 |
| EP | 3664020 A1 | 6/2020 |
| EP | 3690712 A1 | 8/2020 |
| EP | 3690742 A1 | 8/2020 |
| EP | 3722992 A1 | 10/2020 |
| EP | 3690730 A2 | 11/2020 |
| EP | 3739486 A1 | 11/2020 |
| EP | 3501897 B1 | 12/2020 |
| EP | 3751455 A2 | 12/2020 |
| EP | 3783527 A1 | 2/2021 |
| GB | 2402572 B | 8/2005 |
| GB | 2548087 A | 9/2017 |
| GB | 2577485 A | 4/2020 |
| GB | 2517270 B | 6/2020 |
| JP | 2578262 Y2 | 8/1998 |
| JP | 3941252 B2 | 7/2007 |
| JP | 4282583 B2 | 6/2009 |
| JP | 4300098 B2 | 7/2009 |
| JP | 2015004922 A | 1/2015 |
| JP | 5863536 B2 | 2/2016 |
| JP | 6044134 B2 | 12/2016 |
| JP | 6525707 B2 | 6/2019 |
| JP | 2019101535 A | 6/2019 |
| JP | 2020101927 A | 7/2020 |
| JP | 2020173744 A | 10/2020 |
| KR | 100326702 B1 | 2/2002 |
| KR | 101082878 B1 | 11/2011 |
| KR | 101738422 B1 | 5/2017 |
| KR | 101969864 B1 | 4/2019 |
| KR | 101996167 B1 | 7/2019 |
| KR | 102022388 B1 | 8/2019 |
| KR | 102043143 B1 | 11/2019 |
| KR | 102095335 B1 | 3/2020 |
| KR | 102097120 B1 | 4/2020 |
| KR | 1020200085490 A | 7/2020 |
| KR | 10218926281 | 12/2020 |
| KR | 1020200142266 A | 12/2020 |
| TW | 200630819 A | 9/2006 |
| TW | I294089 B | 3/2008 |
| TW | I306207 B | 2/2009 |
| WO | WO 02/052835 | 7/2002 |

| WO | WO 16/032398 | 3/2016 |
| WO | WO 16/048108 | 3/2016 |
| WO | WO 16/207875 | 12/2016 |
| WO | WO 17/158622 | 9/2017 |
| WO | WO 19/005547 | 1/2019 |
| WO | WO 19/067695 | 4/2019 |
| WO | WO 19/089339 | 5/2019 |
| WO | WO 19/092456 | 5/2019 |
| WO | WO 19/099622 | 5/2019 |
| WO | WO 19/122952 | 6/2019 |
| WO | WO 19/125191 | 6/2019 |
| WO | WO 19/126755 | 6/2019 |
| WO | WO 19/144575 | 8/2019 |
| WO | WO 19/182782 | 9/2019 |
| WO | WO 19/191578 | 10/2019 |
| WO | WO 19/216938 | 11/2019 |
| WO | WO 19/220436 | 11/2019 |
| WO | WO 20/006154 | 1/2020 |
| WO | WO 20/012756 | 1/2020 |
| WO | WO 20/025696 | 2/2020 |
| WO | WO 20/034663 | 2/2020 |
| WO | WO 20/056157 | 3/2020 |
| WO | WO 20/076356 | 4/2020 |
| WO | WO 20/097221 | 5/2020 |
| WO | WO 20/101246 | 5/2020 |
| WO | WO 20/120050 | 6/2020 |
| WO | WO 20/121973 | 6/2020 |
| WO | WO 20/131140 | 6/2020 |
| WO | WO 20/139181 | 7/2020 |
| WO | WO 20/139355 | 7/2020 |
| WO | WO 20/139357 | 7/2020 |
| WO | WO 20/142193 | 7/2020 |
| WO | WO 20/146445 | 7/2020 |
| WO | WO 20/151329 | 7/2020 |
| WO | WO 20/157761 | 8/2020 |
| WO | WO 20/163455 | 8/2020 |
| WO | WO 20/167667 | 8/2020 |
| WO | WO 20/174262 | 9/2020 |
| WO | WO 20/177583 | 9/2020 |
| WO | WO 20/185233 | 9/2020 |
| WO | WO 20/185234 | 9/2020 |
| WO | WO 20/195658 | 10/2020 |
| WO | WO 20/198189 | 10/2020 |
| WO | WO 20/198779 | 10/2020 |
| WO | WO 20/205597 | 10/2020 |
| WO | WO 20/221200 | 11/2020 |
| WO | WO 20/240284 | 12/2020 |
| WO | WO 20/260020 | 12/2020 |
| WO | WO 20/264010 | 12/2020 |

OTHER PUBLICATIONS

Lei Tai, Shaohua Li and Ming Liu, "A Deep-Network Solution Towards Model-less Obstacle Avoidance", Oct. 9-14, 2016, 2016 IEEE/RSJ International Conference on Intelligent Robots and Systems, p. 2759-2764 (Year: 2016).*

Bojarski, M. et al., "End to End Learning for Self-Driving Cars," Apr. 25, 2016, nine pages.

Eigen, D. et al., "Depth Map Prediction from a Single Image using a Multi-Scale Deep Network," 2014, nine pages.

Eigen, D. et al., "Predicting Depth, Surface Normals and Semantic Labels with a Common Multi-ScaleConvolutional Architecture," Dec. 17, 2015, nine pages.

Gupta, S. et al., "Learning Rich Features from RGB-D Images for Object Detection and Segmentation," Jul. 22, 2014, 16 pages.

He, K et al., "Deep Residual Learning for Image Recognition," Dec. 10, 2015, 12 pages.

Karpathy, A. et al., "Large-Scale Video Classification with Convolutional Neural Networks," 2014, eight pages.

Simonyan, K. et al., "Two-Stream Convolutional Networks for Action Recognition in Videos," Nov. 12, 2014, 11 pages.

Zbontar, J. et al., "Stereo Matching by Training a Convolutional Neural Network to Compare ImagePatches," Journal of Machine Learning Research 17, Apr. 2016, pp. 1-32.

PCT International Search Report and Written Opinion, PCT Application No. PCT/US17/68567, May 1, 2018, 19 pages.

(56)                    References Cited

OTHER PUBLICATIONS

PCT International Search Report and Written Opinion, PCT Application No. PCT/US18/24197, Jun. 6, 2018, 15 pages.
PCT Invitation to Pay Additional Fees, PCT Application No. PCT/US17/68567, Mar. 6, 2018, 2 pages.

\* cited by examiner

Figures 1A, 1B:
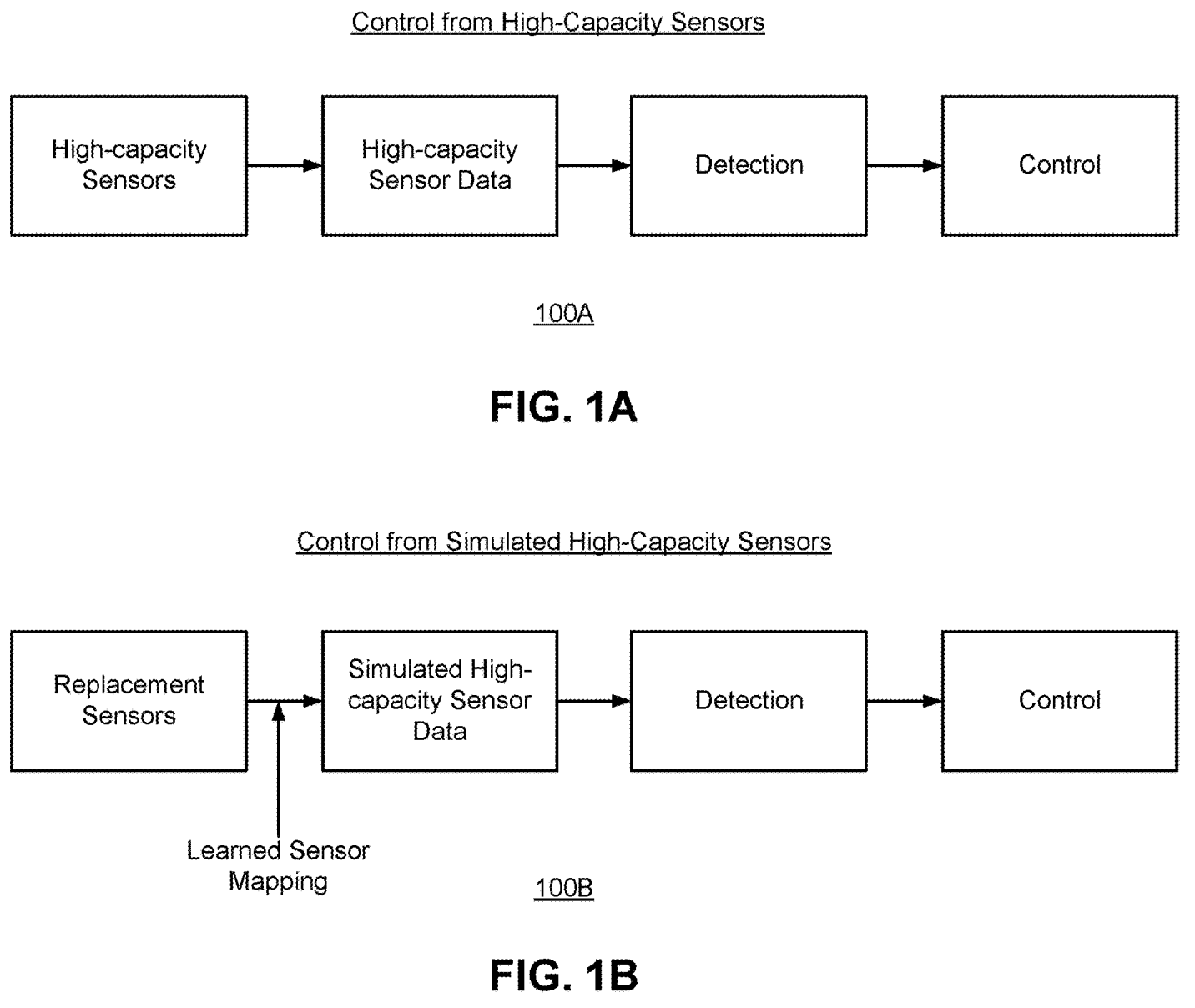

Control from High-Capacity Sensors

| High-capacity Sensors | → | High-capacity Sensor Data | → | Detection | → | Control |

Control from Simulated High-Capacity Sensors

| Replacement Sensors | → | Simulated High-capacity Sensor Data | → | Detection | → | Control |

Learned Sensor Mapping

Autonomous Control System 110

Replacement Sensors 112B

Sensor Simulation Module 114

Detection Module 116

Segmentation Module 117

Control Module 119

Network 120

Modeling System 130

Sensor Collection System 150

High-capacity Sensors 112A

Replacement Sensors 112B

200

MULTI-CHANNEL SENSOR SIMULATION FOR AUTONOMOUS CONTROL SYSTEMS

CROSS-REFERENCE TO RELATED APPLICATIONS

This application is a continuation of, and claims priority to, U.S. patent application Ser. No. 15/855749 titled "MULTI-CHANNEL SENSOR SIMULATION FOR AUTONOMOUS CONTROL SYSTEMS" and filed on Dec. 27, 2017. U.S. patent application Ser. No. 15/855,749 claims the benefit of provisional U.S. Application No. 62/440,289, filed on Dec. 29, 2016, and provisional U.S. Application No. 62/530,788, filed on Jul. 10, 2017. Each of the above-recited applications are hereby incorporated herein by reference in its entirety.

BACKGROUND

This invention relates generally to autonomous control systems for vehicles, and more particularly to autonomous control systems for vehicles using sensors.

Autonomous control systems are systems that guide vehicles (e.g., automobiles, trucks, vans) without direct guidance by human operators. Autonomous control systems analyze the surrounding physical environment in various ways to guide vehicles in a safe manner. For example, an autonomous control system may detect and/or track objects in the physical environment, and responsive to a detected object, guide the vehicle away from the object such that collision with the object can be avoided. As another example, an autonomous control system may detect boundaries of lanes on the road such that the vehicle can be guided within the appropriate lane with the flow of traffic. The input to autonomous control systems is information related to the physical environment surrounding the vehicles that are detected by one or more sensors. Often times, the sensors are high-capacity sensors that are complex, expensive, and bulky.

SUMMARY

An autonomous control system combines sensor data from multiple sensors to simulate sensor data from high-capacity sensors. The sensor data contains information related to physical environments surrounding vehicles for autonomous guidance. For example, the sensor data may be in the form of images that visually capture scenes of the surrounding environment, geo-location of the vehicles, and the like.

High-capacity sensors are sensors that may have improved characteristics over other sensors in terms of, for example, resolution, field-of-view, or the like. A small number of high-capacity sensors may be sufficient to collect a substantial amount of information on the environment. However, high-capacity sensors can be costly and complex. In one embodiment, the high-capacity sensors include light detection and ranging (LIDAR) sensors that have a 360-degree field of view for data collection.

In contrast, some sensors may have smaller capacity than high-capacity sensors, but may be relatively inexpensive, portable, and readily available than high-capacity sensors. In one embodiment, the autonomous control system simulates high-capacity sensor data of the physical environment from a combination of replacement sensors that may each have lower capacity than high-capacity sensors. In one embodiment, the high-capacity sensor data is simulated via one or more neural networks. The autonomous control system performs various detection and control algorithms on the simulated sensor data to guide the vehicle autonomously.

The autonomous control system allows vehicles that lack expensive and complex high-capacity sensors to achieve autonomous guidance even with information from sensors that may have lower capacity than these high-capacity sensors. In addition, the autonomous control system can take advantage of existing detection and control systems, since many detection and control systems may be configured for high-capacity sensor data.

BRIEF DESCRIPTION OF THE DRAWINGS

FIG. 1A illustrates a general process of an autonomous control system using high-capacity sensor data, in accordance with an embodiment. FIG. 1B illustrates a general process of an autonomous control system with high-capacity sensor simulation, in accordance with an embodiment.

Figure 2:
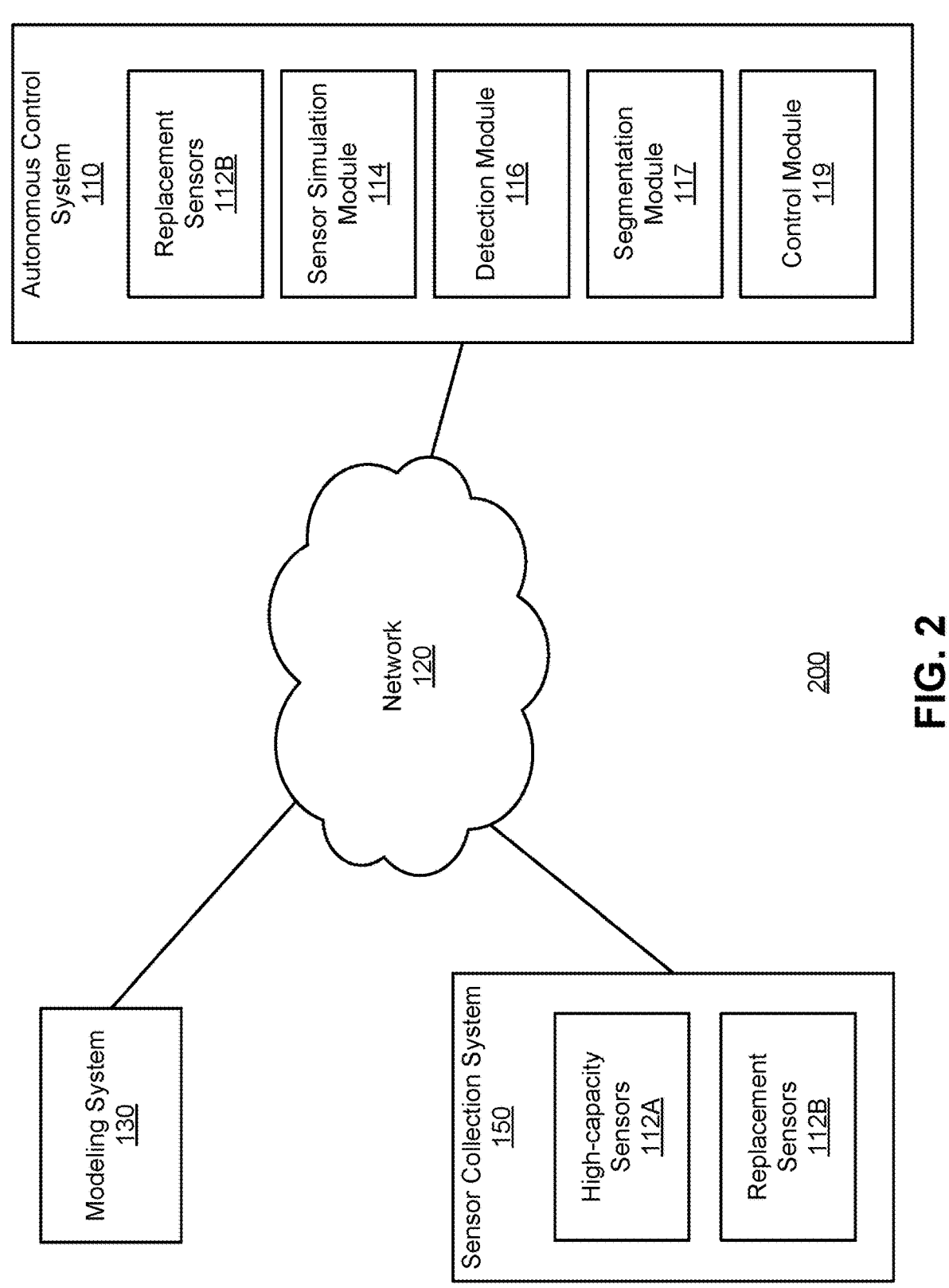
FIG. 2 is an example network environment for autonomous control, in accordance with an embodiment.

The figures depict various embodiments of the present invention for purposes of illustration only. One skilled in the art will readily recognize from the following discussion that alternative embodiments of the structures and methods illustrated herein may be employed without departing from the principles of the invention described herein.

DETAILED DESCRIPTION

Overview

FIG. 1A illustrates a general process 100A of an autonomous control system using high-capacity sensor data, in accordance with an embodiment. FIG. 1B illustrates a general process 100B of an autonomous control system with high-capacity sensor simulation, in accordance with an embodiment. These processes may be performed by an autonomous control system, for example as shown in the network 200 of FIG. 2.

The autonomous control system guides vehicles based on information related to the surrounding environment received from one or more sensors attached to the vehicles. The vehicles are any means of conveyance or transport in or by which someone or something can travel from one place to another, and may include automobiles, trucks, vans, robotic transports, and the like. The autonomous control system may guide a vehicle through one or more trips from one destination to another. For example, the autonomous control system may guide a ride-sharing vehicle (e.g., a taxi) from a passenger's point of pick-up to their desired destination. Though described herein as an autonomous vehicle, the control decisions of the autonomous controls system may provide semi-autonomous control rather than complete control of the vehicle, for example to supplement or override user control, or as primary means of control that can be overridden by a user. In addition, although the autonomous control system is described herein as a system that guides vehicles, the autonomous control system may also guide other systems such as robotic arms or manufacturing equipment.

One or more sensors can be attached to the vehicles to gather information used to generate the control of the vehicle. The sensors are devices that detect information related to the physical environment. The information can be captured through many forms. For example, the sensors may be imaging sensors that capture scenes of the physical environment through a series of one or more images. In such an example, other vehicles proximate to the vehicle of the autonomous control system, stationary objects such as trees, fire hydrants, lamp posts, and the like may be captured in the images. As another example, the sensors may be geo-locational sensors, and more specifically global positioning system (GPS) sensors that detect the position of the sensor (and its attached vehicle) relative to a map of the physical environment.

The autonomous control system performs various detection and control algorithms based on the physical environment information to guide the vehicles in a safe and efficient manner. For example, the autonomous control system may detect various objects (e.g., lamp post, cars) that are proximate to a vehicle in the captured images of the environment, and guide the vehicle away from the objects to prevent collision of the vehicle with the objects. As another example, the autonomous control system may detect boundaries of lanes on the road such that the vehicle can be guided within the appropriate lane with the flow of traffic.

Some sensors may have improved characteristics over others. For example, high-capacity imaging sensors may generate images having improved image characteristics, such as increased resolution, data collection time, sharpness, field-of-view, and the like, compared to other sensors. As another example, high-capacity geo-locational sensors may pinpoint the location of the sensor more accurately than others. As another example, some high-capacity sensors are able to detect information at a level of accuracy or precision that other sensors cannot. For example, light detection and ranging (LIDAR) sensors can measure the distance from the sensor to an object at a level of accuracy that is difficult to achieve for image sensors. Alternatively, more-sophisticated LIDAR sensors may generate greater precision data than less-sophisticated LIDAR sensors. In general, high-capacity sensors tend to be complex, expensive, and bulky. Moreover, it may be difficult for an owner (or a manufacturer) of a vehicle to purchase and install high-capacity sensors separately on his or her vehicle.

On the other hand, due to their high capacity, only a few or even a single high-capacity sensor may be needed to collect a substantial amount of information on the physical environment for accurate performance of the autonomous control system. For example, a single LIDAR sensor on a vehicle can capture a 360-degree field-of-view of the physical environment through high-resolution signals that may be alone sufficient for accurate performance of the autonomous control system.

In contrast, some sensors may have smaller capacity than high-capacity sensors, but may be more readily available than high-capacity sensors in that they are portable, easier to install, and relatively inexpensive. For example, a vehicle may include sensors at the front and/or back of the car that provide real-time images of the surroundings such that the operator can detect objects to avoid collisions with the object. However, these sensors have limited field-of-view that captures only a portion of the environment at the front and/or back of the vehicle. As another example, portable radio detection and ranging (RADAR) sensors may be able to detect distance of objects better than imaging sensors, but still may not have the accuracy as a high-capacity LIDAR sensor. As another example, portable cameras are easy to install on windshield or dashboard areas of the vehicle, but may lack the resolution and field-of-view of LIDAR sensors.

In contrast to high-capacity sensors, each sensor in a set of low-capacity sensors may provide fragments of information on the surrounding environment in different formats of sensor data and have lower precision information. However, the combination of sensor data as disclosed herein may contain information comparable to that generated from high-capacity sensors. For example, a vehicle may have a RGB camera with a first resolution at the back of a vehicle, a greyscale camera with a second resolution at the dashboard of the vehicle, another RGB camera with a third resolution at the left and right sides of the vehicle, and a portable RADAR sensor. Individually, each camera has a fragmented field-of-view limited to one among the front, back, and sides of the vehicle in different resolutions and color, and the portable RADAR sensor has sub-optimal distance measurements. Through the analysis and modeling of these sensors discussed herein, the sensors together may contain information on objects and the physical environment that is comparable to a high-capacity LIDAR sensor by simulating the high-capacity sensor output with a learned sensor mapping from the sensors to the desired high-capacity sensor data.

In one embodiment, the autonomous control system may perform the detection and control algorithms on sensor data generated by high-capacity sensors. As shown in FIG. 1A, the autonomous control system receives high-capacity sensor data. The autonomous control system detects and tracks one or more objects identified in the representation of the physical environment by high-capacity sensor data. The autonomous control system controls the vehicle based on the detected objects to guide the vehicle autonomously. In general, the detection and control systems are relatively accurate when using high-capacity sensor data, since a substantial amount of information on the surrounding environment is contained through a single type of sensor data. However, as described above, many vehicles may lack high-capacity sensors due to their complexity and cost.

In one embodiment, the autonomous control system may perform the detection and control algorithms on sensor data generated by replacement sensors having different capacity than high-capacity sensors that do not natively capture the precision or quality of sensor data available from the high-capacity sensor(s). Specifically, the autonomous control system simulates high-capacity sensor data from sensor data generated by a set of replacement sensors. Specifically, as shown in FIG. 1B, the autonomous control system receives sensor data from replacement sensors that differ from the high-capacity sensors, and may have different characteristics from one another, attached at various positions of the vehicle, or capture different fields of view. The autonomous control system synthesizes the combination of sensor data with a learned sensor mapping to simulate high-capacity sensor data as though the surrounding environment was characterized by high-capacity sensors. The autonomous control system detects one or more objects based on the simulated high-capacity sensor data to control the vehicle for autonomous guidance.

In one embodiment, the simulated high-capacity sensor data is synthesized through one or more machine-learned models. The one or more machine-learned models may be neural networks such as deep neural networks (DNN), convolutional neural networks (CNN), and the like.

In general, using simulated high-capacity sensor data for detection and control allows accurate guidance of the vehicle by using replacement sensors that may be relatively inexpensive and readily available compared to high-capacity sensors. In addition, the autonomous control system can use existing control and detection systems that are configured for high-capacity sensor data. Returning to the example above, the autonomous control system may synthesize the sensor data from the set of cameras with different resolution, color, and field-of-view (e.g., front, back, left, and right sides), and the portable RADAR sensor to simulate sensor data from a single LIDAR sensor having a large field-of-view and high resolution. The simulated data may be used as input to existing detection and control systems that use LIDAR sensor data.

FIG. 2 is an example network environment 200 for autonomous control, in accordance with an embodiment. The network environment 200 includes an autonomous control system 110, a sensor collection system 150, and a modeling system 130 coupled to a network 120.

The sensor collection system 150 is attached to one or more data collection vehicles, and includes one or more sensors including high-capacity sensors 112A and replacement sensors 112B. The sensor collection system 150 collects training information related to the physical environment using both the high-capacity sensors 112A and the replacement sensors 112B, such that relationships can be learned between sensor data from the high-capacity sensors 112A and replacement sensors 112B.

The one or more sensors of the sensor collection system 150 can include active sensors and passive sensors. A passive sensor observes the environment. Passive sensors can include cameras, or microphones, vibration sensors, and the like. Passive sensors include a receiver that detects and measures various forms of energy that are naturally emitted from the physical environment or constituents of the physical environment across various locations of the environment. As an example, when the sensor is a camera, the sensor data is a time series of pixel data indicating intensities of detected light. That is, a time series of pictures is acquired. Each picture is divided into pixels and each pixel may have one or more intensity values associated with it depending on whether the camera is a greyscale camera or a color camera. For example, when the camera is a color camera describing a color of a pixel in red, green, and blue, the intensity value for each is typically an integer, such as an 8, 10, or 12-bit integer specifying the intensity of the red, green, or blue portion of the frequency. If the resolution of the picture were 100×100 pixels (having 10,000 total pixels), for every picture, there would be 3 separate channels of 10,000 pixels.

When the sensor is a microphone, the sensor data is a time series of air pressure values. In one embodiment, the time series of air pressure values is converted into a spectrogram. A spectrogram shows a time series of components (strengths) showing a collection of frequency strengths for each time period. The spectrogram is generated from the initial sound waves by a discrete Fourier transform. The size of the sensor data can be adjusted by adjusting the number of frequencies used in the Fourier transform.

When the sensor is a vibration sensor, the sensor data is a time series of physical displacements of the vibration sensor in the system. The vibration sensor is typically attached or near to a particular component of the system to represent vibration of that component. Similarly to the microphone, in one embodiment, the time series of physical displacements are converted into a spectrogram, and the number of frequencies used in the Fourier transform can be adjusted.

The one or more sensors may include active sensors. Active sensors emit energy and then measure the energy that is reflected back to one or more receivers in the sensor. The reflected energy allows active sensors to probe for environmental information that may not otherwise be readily detected passively at the sensor. For example, active sensors may estimate distances of objects from the sensor better than passive sensors. Active sensors include both a transmitter and receiver of energy, in contrast to passive sensors that use receivers. Active sensors can include ultrasound sensors, RADAR sensors, active infrared (IR) sensors, LIDAR sensors, and the like. Usually, ultrasound sensors emit ultrasound waves, RADAR sensors emit microwaves, LIDAR sensors emit laser pulses in the near-IR or visible range waves, and IR sensors emit IR waves.

In one instance, the sensor data includes depth measurements that measures how far away an object is from the sensor. Specifically, the depth is measured by triggering a timer when the energy is emitted, and detecting the amount of time needed for the receiver to detect the reflected energy. The traveling speed of the energy can be used to calculate the depth of objects at various locations in the environment by emitting energy signals in the direction of the objects. In another instance, the sensor data also includes intensity measurements that measures the intensity of the reflected energy detected at the receiver of the sensor. These intensity values may be represented as 8 or 16-bit integer values.

For many types of active sensors, the sensor data is a collection of data points with reference to the sensor in a three-dimensional (3D) coordinate system ("point cloud" measurements) such as, for example, a spherical coordinate system or a Cartesian coordinate system. Each value designates the measurement of the actively-transmitted signal at the receiver (e.g., depth or reflected intensity). The number of data points in the point cloud is related to the resolution of the sensor. Further, even for a given sensor, the number of data points varies depending on factors such as what portion of the environment is within the sensor's range.

For example, when the sensor is a LIDAR sensor, the sensor data may include a point cloud of intensity measurements and a point cloud of reflectance measurements. Specifically, a narrow beam laser is pointed in a specific, known direction. This known direction can be identified as a pair of angles including a polar angle $\theta$ and an azimuth angle $\varphi$ with reference to the sensor. The polar angle $\theta$ specifies from the upward direction (0 degrees) to the downward direction (180 degrees), while the azimuth angle y specifies from the forward direction (0 degrees) to the backward direction (360 degrees).

By actively emitting energy across the entire field-of-view, a set of measurements for depth and/or intensity can be collected for different values of $(r, \theta, \varphi)$, where r denotes the depth measurement of an object (e.g., ground, cars, trees) to the sensor and $\theta$, $\varphi$ together denote the known direction object. Thus, a 3D view of the environment can be mapped to a point cloud representing objects in the environment by using the returned depth and intensity thereof.

In one embodiment, point cloud measurements are collected with rotational scanning. For example, multiple laser beams (e.g. 64 laser beams) can be emitted from a rotating drum, enabling multiple measurements across various values of 0. In this case, $\theta$ and $\varphi$ are pre-determined by the position of the rotating drum and which of the multiple beams emitted the light, while r is measured based on the time-of-flight of the energy beam as discussed above.

In another embodiment, the point cloud measurements are collected by linear scanning in the (x,y) space. In such implementations, the light source is aimed at one or more mirrors. The mirrors, which may be microscopic mirrors (e.g. MEMS mirrors), can be manipulated programmatically, causing the energy beam to be steered. While mirror-based steering could potentially implement almost any scanning pattern, in practice these systems are usually used to implement grid-like scanning patterns that follow the Cartesian coordinate system.

In yet another embodiment, the point cloud measurements are collected through a phased array. A phased array is typically implemented with no moving parts. Instead, a phased array is made up of multiple transmitters at the same frequency but with different phase delay. A beam-like radiation pattern is achieved by the constructive and destructive interference of these multiple beams. The results of this approach can be viewed in polar coordinates or Cartesian coordinates.

Active sensors such as RADAR and LIDAR may output sparse representations of the environment. This sparsity can arise for a few reasons. For example, most active sensors have a minimum and maximum range at which they can reliably receive a returned signal. For example, a LIDAR sensor specifies a minimum usable return range of 0.9 meters and a maximum usable return range of 120 meters. When objects and the ground plane are outside of this range, no return is received, and therefore the returns comprise a sparse point cloud. As another example, even when objects are within range, occlusions such as rain or fog can lead to diffraction of a LIDAR sensor's laser beams. This can lead to fewer returns, which can cause the point cloud to be more sparse compared to the point clouds that are generated in dry weather.

In one particular embodiment, high-capacity sensors 112A refer to LIDAR sensors. The replacement sensors 112B can refer to sensors such as cameras, RADAR, lower-capacity LIDAR, and the like, that are each attached to various positions on the data collection vehicles, which may have smaller capacity than the high-capacity sensors in some aspect. The sensor collection system 150 provides collected training sensor data to the modeling system 130.

The modeling system 130 receives collected sensor data from the sensor collection system 150, and generates models that predict high-capacity sensor data representations of the environment given sensor data from replacement sensors. In one embodiment, the modeling system 130 uses one or more neural networks to generate the simulated high-capacity sensor data. The predictive models are provided to the autonomous control system 110. A more detailed description of the modeling system 130 is described below in conjunction with FIG. 3.

The autonomous control system 110 includes one or more replacement sensors 112B, a sensor simulation module 114, a detection module 116, a segmentation module 117, and a control module 119. The vehicles that include the autonomous control system 110 may lack high-capacity sensors and use the trained models to simulate high-capacity data from replacement sensors. Specifically, the replacement sensors 112B of the autonomous control system 110 may be sensors attached to various positions of the vehicle, similar to the replacement sensors described in conjunction with the sensor collection system 150. The replacement sensors 112B collect information related to the surrounding environment as the vehicle is operating, and provides the information to the sensor simulation module 114.

The sensor simulation module 114 receives predictive models from the modeling system 130 and sensor data generated by the replacement sensors 112B, and simulates a high-capacity sensor data representation of the physical environment.

The detection module 116 detects objects in the scene based on the simulated high-capacity sensor data received from the sensor simulation module 114. Objects may include both stationary and moving items in the scenery of the physical environment. For example, stationary objects may include guard rails, road signs, or traffic cones. As another example, moving objects may include pedestrians, bicyclists, animals, or vehicles.

In one embodiment, the detection module 116 detects objects using the following mechanism. First, the detection module identifies regions of interest (ROIs) in the simulated data which may contain objects. Next, the detection module determines which ROIs contain objects, and then it classifies the objects into categories such as guard rails, road signs, traffic cones, bicyclists, animals, or vehicles. The detection module 116 may use convolutional neural network models to identify ROIs and classify objects. The detection module 116 may perform further functionalities, such as tracking objects across multiple time steps of data.

The segmentation module 117 semantically classifies regions of the scene based on the simulated high-capacity sensor data received from the sensor simulation module 114.

In one embodiment, the segmentation module 117 performs segmentation on the scene and, importantly, identifies regions of the image that are drivable. In one implementation of this embodiment, the segmentation module 117 uses one or more neural networks to perform low-level semantic segmentation, which consists of classifying the type of object or surface that each point in the point cloud represents. Next, the segmentation module performs grouping or smoothing to create contiguous segments. The segmentation module 117 further performs semantic analysis on the contiguous segments. For example, the road segmentation is further decomposed into lane-marking segments.

The control module 119 determines the path that the robot or vehicle should follow, and it actuates the vehicle to follow the determined path.

In one embodiment, the control module 119 determines the path based on the objects and segments identified by the detection module 116 and the segmentation module 117 in the scene. The control module 119 may be instantiated with a basic directive such as "safely make progress in the current lane, and change lanes or park on the shoulder if the current lane becomes unsafe," or an advanced directive such as "drive to a specific street address." The control module acts on its directive by first plotting possible paths on the drivable terrain identified by the segmentation module 117. These paths may be identified using a motion planning algorithm such as Rapidly Exploring Random Tree (RRT) or A-Star. Next, the control module 119 deletes the paths that may conflict with objects on the road that are identified by the detection module 116. Then, the control module 119 selects the optimal path out of the current path set. Finally, the control module 119 actuates the vehicle to follow the selected path. The control module 119 may refresh its path list at a rate of once every few milliseconds.

In one embodiment, the high-capacity sensors 112A and/or the replacement sensors 112B emit sensor data to various modules of the autonomous control system 110 over the network 120 via a network protocol such as Ethernet. In one embodiment, the various modules of the autonomous control system 110 (e.g., the sensor simulation module 114, the detection module 116, the segmentation module 117, the control module 119) are implemented on a centralized computer in a vehicle. In another embodiment, one or more modules of the autonomous control system 110 may be implemented on separate computers. For example, each module may be implemented on its own dedicated computational hardware.

Modeling System

Figure 3:
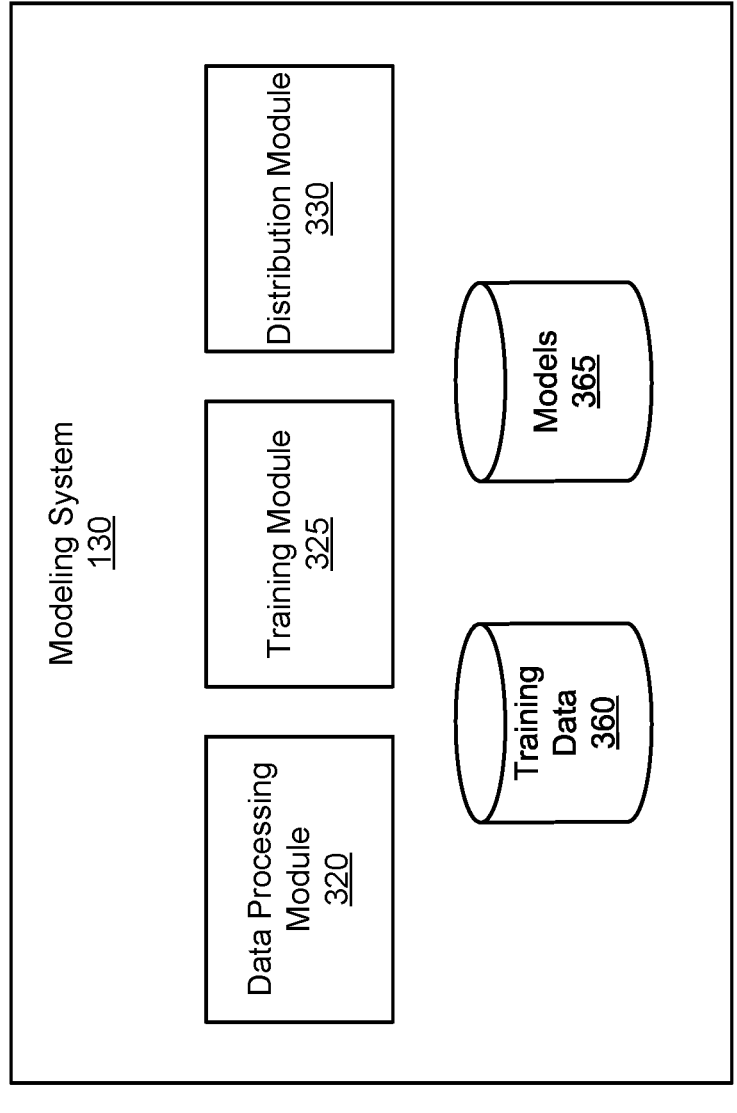
FIG. 3 is an example block diagram of an architecture of the modeling system, in accordance with an embodiment.

FIG. 3 is an example block diagram of an architecture of the modeling system 130, in accordance with an embodiment. The modeling system 130 shown in FIG. 3 includes a data processing module 320, a training module 325, and a distribution module 330. The modeling system 130 also includes a training data store 360 and predictive models 365.

The data processing module 320 receives sensor data from the sensor collection system 150 and encodes the sensor data training data 360 to generate the training data store 360. The training data store 360 includes a set of instances, each instance containing high-capacity sensor data and corresponding sensor data from replacement sensors representing the same portion of the physical environment. For example, the data processing module 320 may represent low-capacity sensor data from a greyscale camera as a vector in which each element corresponds to the intensity value of a single pixel.

In one embodiment, the data processing module 320 transforms sensor data to make sensors mutually compatible, irrespective of sensor positioning and configuration. For example, the data processing module 320 may transform sensor data from one replacement sensor aimed 5 degrees upward with respect to the ground plane into the perspective of a replacement aimed flat with respect to the ground plane. In another embodiment, the data processing module 320 transforms all replacement sensors into representation compatible with a single sensor. This single unified representation may correspond to either a real or virtual sensor. Sensor data transformations may include one or more operations, including affine transformation (including reflection, scaling, rotation, shearing, and so on), perspective transformation, 3D projection, change of basis, and the like.

In one embodiment, the data processing module 320 represents each data point in a point cloud as a vector. In one embodiment, each data point may be represented using a data structure containing an (x, y, z) location. This may be referred to as the coordinate (COO) storage format. In another embodiment, each data point may be represented using a data structure containing polar coordinates (r, θ, φ).

In one embodiment, the data processing module 320 represents each data point in a point cloud as a point cloud dense matrix (PCDM). Some sensors, such as the mirror-based scanning LIDAR sensor, may produce point clouds in which the points are arranged in a grid-based fashion. That is, if an appropriately-sized Cartesian grid was overlaid on top of the point cloud in (x, y) space, each point would fit into one grid cell. However, as mentioned previously, it is common that some of the grid cells are empty. In the PCDM representation, given a sensor that produces a grid-patterned point cloud, the point cloud is overlaid onto a multi-dimensional, most commonly two-dimensional (2D), array that represents a Cartesian grid, and the grid cells for which a point exists in the point cloud is filled in with the corresponding measurement. For example, the measurements may be numerical values indicating reflectance intensity measurements or depth measurements of LIDAR sensors. Empty cells may be filled with a default (e.g. NaN) value.

Figure 4:
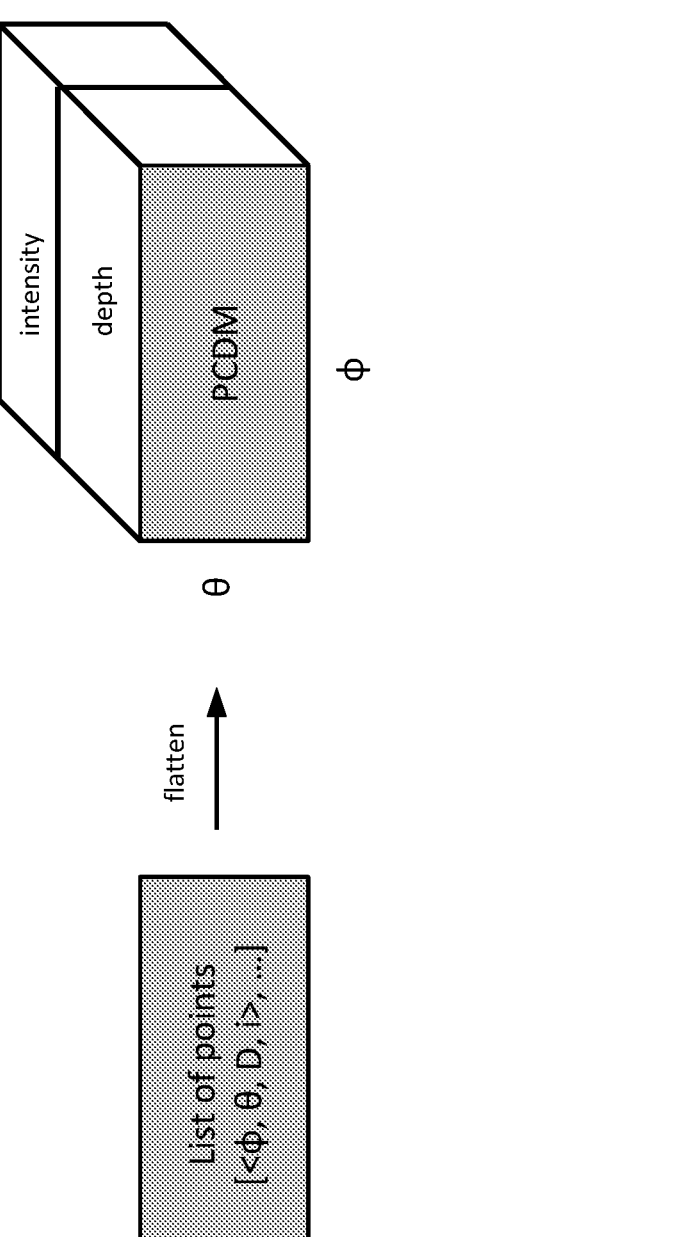
FIG. 4 illustrates an example point cloud dense matrix representation for sensors that generate point clouds expressed in polar coordinates.

FIG. 4 illustrates an example PCDM representation for sensors that generate point clouds expressed in polar coordinates.

Some sensors, such as the rotating mechanical scanning LIDAR sensor, produce point clouds in which the points are organized in rotational bands. These points may not fit into Cartesian coordinates. In such an example, the data processing module 320 may define a multi-dimensional "polar array" in which the dimensions represent polar coordinates. For example, as shown in FIG. 4, the X dimension of the array may represent θ, and the Y dimension of the array may represent φ. At each (θ, φ) index in the array, the depth (r) is stored, and other information, such as intensity, color, temperature, or velocity may also be stored.

In one particular embodiment, the high-capacity sensor data in the training store 360 is high-quality LIDAR sensor data processed into a PCDM structure by the data processing module 320.

In another embodiment, the data processing module 320 represents sensor data as a dense depth map (DDM), where the data processing module 320 uses interpolation techniques to fill in missing points in sensor data. For example, the data processing module 320 may interpolate missing points in a RADAR PCDM matrix based on neighboring points.

In one embodiment, the high-capacity sensor data in the training store 360 is high-quality LIDAR sensor data processed into a dense depth map (DDM) by the data processing module 320.

In one embodiment, the data processing module 320 includes sensor data at a given point in time ("timestep") in each instance of the training data store 360. As an example, an instance for a RADAR replacement sensor in the training data store 360 may include data from a single timestep of 1 second. In another embodiment, the data processing module 320 includes sensor data aggregated from a sequence of timesteps from the replacement sensors in each instance of the training data store 360. This embodiment has the advantage of being able to observe more sensor readings, which may enable it to generate more accurate predictions. In such an embodiment, the data processing module 320 may store the sensor data as a concatenated vector in which sensor data from each time step are concatenated with each other. For example, a training data instance may consist of two seconds of LIDAR readings collected from high-quality LIDAR sensors.

When the dimensions of sensor data are not equal across different instances of the training data store 360, the data processing module 320 may apply one or more data reshaping techniques to the sensor data such that dimensions are equal across all instances of the training data store 360.

In one embodiment, the data processing module 320 re-shapes the sensor data using interpolation techniques. Interpolation techniques may include max-pooling, average-pooling, and bilinear interpolation.

In one embodiment, the data processing module 320 represents sensor data as multi-dimensional arrays of continuous floating-point values. In another embodiment, the data processing module 320 represents sensor data as a multi-dimensional array of values, in which each index of the array indicates a bin. Each bin corresponds to a specific range of values. For example, an index in the array may represent the depth r in a PCDM as the value 1 if the value of r is in the range [0 cm, 1 cm), and as the value 2 if the value is in the range [1 cm, 2 cm), and so on.

The training module 325 receives the training data store 360, and trains one or more predictive models that generate simulated high-capacity sensor data given sensor data from replacement sensors. The training module 316 constructs the one more predictive models based on the training data store 360. Generally, the predictive model captures the dependence between sensor data from replacement sensors and sensor data from high-capacity sensors in the training data 30 such that a loss function is minimized. Specifically, the loss function $l(y_i \in S, u_i \in S; \theta)$ represents discrepancies between values of collected high-capacity sensor data $y_i \in S$ for one or more data instances S in the training data 360, and the simulated sensor data generated using the predictive models $u_i \in S$.

In one particular implementation, the loss function $(y_i \in S, u_i \in S; \theta)$ is a function of the Euclidean distance between $y_i$ and $u_i$ for data instance i in the training data S. In another implementation, the loss function $(y_i \in S, u_i \in S; \theta)$ is a softmax loss when the high-capacity sensor data $y_i$ is represented as an array of values that each indicates whether the sensor data value is within a corresponding bin with a specific range. In such an instance, the loss rewards the model for selecting the correct bin.

The prediction model may be a parametric model in which one or more parameters $\theta$ mathematically specify the dependence between the sensor data from replacement sensors and high-capacity sensors. Typically, various parameters of parametric-type predictive models that minimize the loss function $(y_i \in S, u_i \in S; \theta)$ are determined through gradient-based numerical optimization algorithms, such as batch gradient algorithms, stochastic gradient algorithms, and the like.

To train the replacement sensors to reflect the same equivalent high-frequency data that would occur at the time of the high-capacity sensors, the training of the network may use synchronized data, such that the training data reflects training of the model for replacement sensor data that occurred at the same time as the high-capacity sensors.

In one embodiment, the predictive models are one or more neural networks trained by the training module 325. A neural network (NN) is a system comprised of one or more layers, such that the layers are limited to mathematically differentiable data transformations. Examples of mathematically differential data transformations include, but are not limited to, matrix multiplication, convolution, recurrent layers, max- or average-pooling, and rectified linear units. The neural network models may be trained according to the backpropagation method. The neural network models may receive pre-processed sensor data or the output of the neural network models may be post-processed.

Figures 5A, 5B:
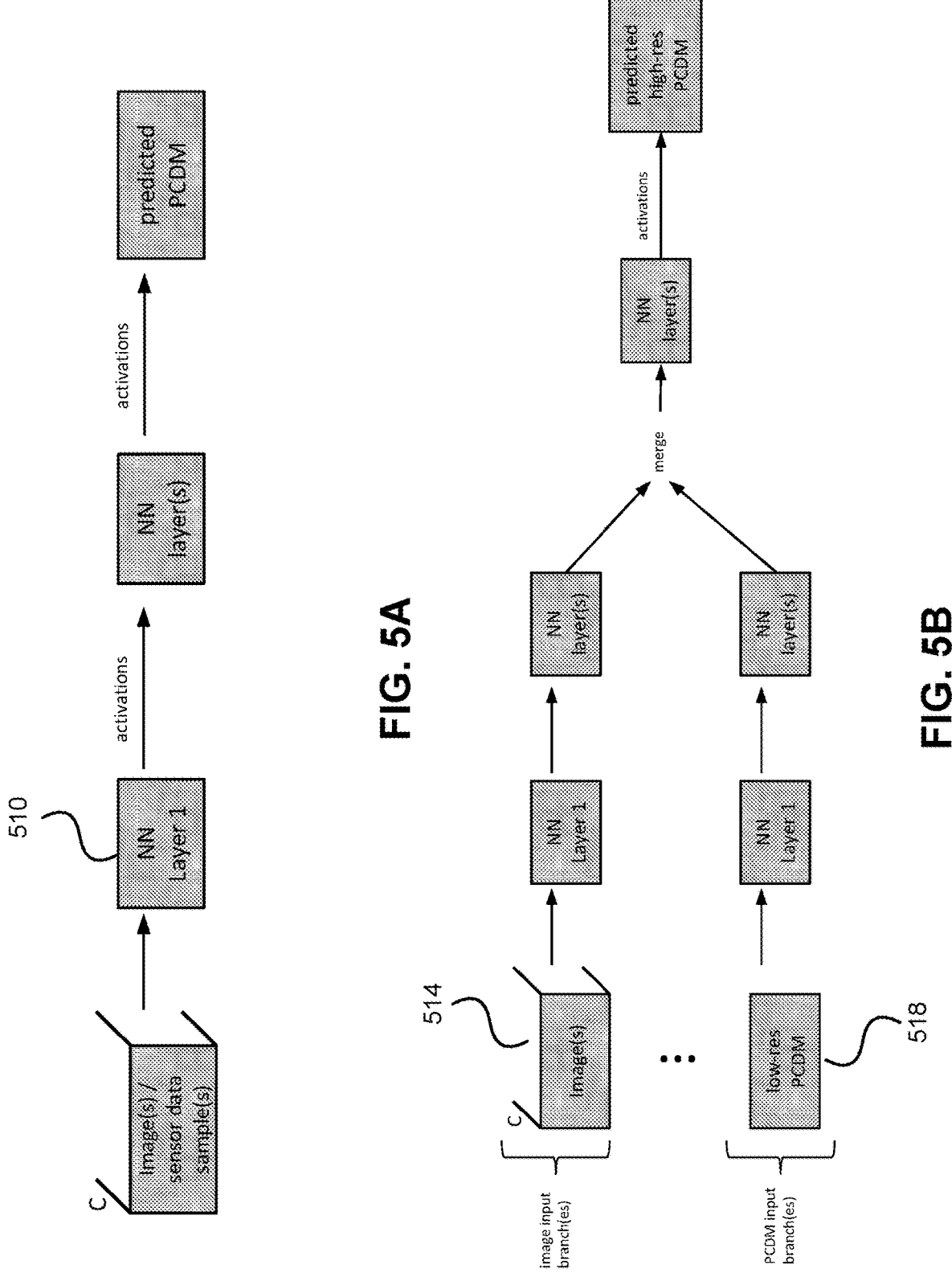
FIG. 5A illustrates an example neural network structure, in accordance with an embodiment.
FIG. 5B illustrates an example neural network structure, in accordance with another embodiment.

FIG. 5A illustrates an example neural network structure, in accordance with an embodiment. FIG. 5B illustrates an example neural network structure, in accordance with another embodiment.

In one embodiment, as shown in FIG. 5A, the one or more neural network models have a single-branch structure (SBNN) in which all sensor data from replacement sensors are input into one neural network model layer. As shown in the example of FIG. 5A, the data from all of the replacement sensors in each training data instance is put into layer 510. In one embodiment, the data from each replacement sensor is stored in one or more channels (C) of the input data structure. For example, training data instances of individual timesteps may be input into the SBNN. As another example, training data instances of sequences of timesteps in concatenated form may be input into the SBNN.

In another embodiment of the SBNN model structure, data items from sensor data instances are concatenated in the horizontal and/or vertical dimension to form a panorama that combines the images with overlapping field-of-view into a single image. For example, when there are three cameras camera and two RADARs, the camera data is organized into a panorama in RGB space, and the RADAR data is organized into a panorama. Reshaping is applied to one or both of the panoramas. The camera panorama occupies 3 channels (C) of the SBNN input data structure, and the RADAR data occupies one channel of the SBNN input data structure. In another implementation, instead of using simple concatenation, content-aware panorama stitching techniques may be applied to avoid jagged edges between individual data samples in the panorama.

In another embodiment, as shown in FIG. 5B, the one or more neural network models have a multiple-branch input structure (BINN) in which one or more of the replacement sensor data has its own separate branch of neural network layers in the predictive model. In one particular embodiment, each replacement sensor has a corresponding input data structure to the NN, and each replacement sensor also has its own "branch," consisting of one or more layers. As shown in the example of FIG. 5B, one branch 514 exists for RGB camera images, and another branch 518 exists for low-resolution LIDAR sensor data in PCDM format.

Partway through the NN model, the branches are merged using a mechanism such as concatenation or addition. Having some layers that are unique to each replacement sensor enables the NN to learn the unique behavior of each sensor, and to be robust to each sensor's offset in factors such as timing or spatial orientation. Also, while SBNN models require any sensor-specific data reshaping to occur as a preprocessing step, BINN models can have per-sensor reshaping inside the network structure. In one embodiment, the in-network reshaping may also be implemented using interpolation techniques such as max-pooling, average-pooling, and bilinear interpolation. In another embodiment, the in-network reshaping may be implemented using convolution or deconvolution layers with non-unit strides in which the value of a pixel in the output image of the layer is determined by applying a filtering algorithm to the values of the pixels in the neighborhood of the corresponding pixel in the input image.

In another embodiment, each branch of the neural network model may correspond to different timesteps. In yet another embodiment, each branch of the model may correspond to certain classifications of replacement sensor data. For example, one branch may correspond to all RADAR sensors in the training data 360, and another branch may correspond to all cameras in the replacement data.

Figure 6:
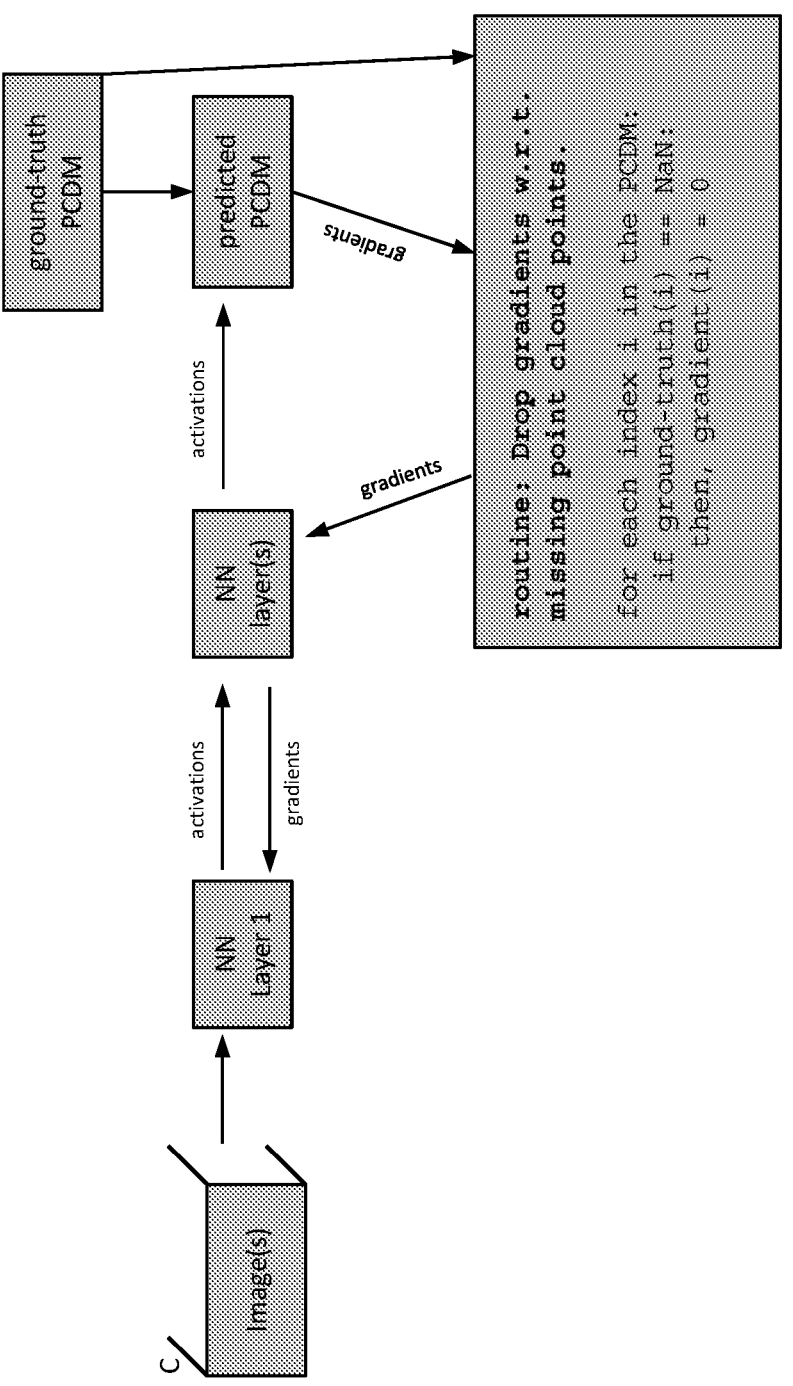
FIG. 6 illustrates an example training process for neural networks, in accordance with an embodiment.

FIG. 6 illustrates an example training process for neural networks, in accordance with an embodiment.

In one embodiment, as shown in FIG. 6, the training module 325 accounts for missing values in sensor data during the training process. Sensor data from active sensors can contain placeholder values such as NaNs that indicate points where the active sensor did not receive a return. Ordinary backpropagation methods do not include a mechanism for addressing missing data. The training module 325 may account for this issue by setting the backpropagation gradient to 0 for indices in the high-capacity sensor data $y_i \in S$ for one or more data instances S in the training data 360 that have missing values. A gradient value of zero has no effect on training, because gradients are typically added to estimated values of the model parameters, and a 0-value gradient means that the estimated value for a parameter for that time step remains constant. Data points with non-missing values are backpropagated.

In one embodiment, the neural network has output channels that produce confidence scores for the correctness of its predictions for the high-capacity sensor data. In one specific implementation, this is achieved by training one of the output channels of the neural network to estimate the distance between the neural network's predicted depth and the depth measured by a high-capacity sensor. In one implementation, confidence scores generated in the sensor simulation module 114 are used to "warn" the control system 119 about regions of the roadway that are not currently understood in detail. For example, these may be regions of the roadway associated with characteristics that were not sufficiently present in the training data set. The control system 119 may use the confidence scores to approach those areas with caution or otherwise affect control based on the confidence that predicted areas are correct, for example to avoid driving towards an unknown area or to reduce speed when approaching an area with low condifence.

In one embodiment, the neural network can generate multiple depth readings for a given position. For a given (x,y) or (θ, φ) position, some sensors can produce multiple depth (r) readings. For example, when a LIDAR sensor is positioned in front of a glass window, it may perceive both the window and objects behind the window, generating two different depth readings. If a high-capacity sensor is capable of generating multiple depth readings per position, then the neural network can be trained to produce multiple depth readings per position. In one implementation, if the high-capacity sensor data produces up to 10 depth readings per position, then the neural network has ten output channels that contain the neural network's depth predictions.

The foregoing description of the embodiments of the invention has been presented for the purpose of illustration; it is not intended to be exhaustive or to limit the invention to the precise forms disclosed. Persons skilled in the relevant art can appreciate that many modifications and variations are possible in light of the above disclosure.

Some portions of this description describe the embodiments of the invention in terms of algorithms and symbolic representations of operations on information. These algorithmic descriptions and representations are commonly used by those skilled in the data processing arts to convey the substance of their work effectively to others skilled in the art. These operations, while described functionally, computationally, or logically, are understood to be implemented by computer programs or equivalent electrical circuits, microcode, or the like. Furthermore, it has also proven convenient at times, to refer to these arrangements of operations as modules, without loss of generality. The described operations and their associated modules may be embodied in software, firmware, hardware, or any combinations thereof.

Any of the steps, operations, or processes described herein may be performed or implemented with one or more hardware or software modules, alone or in combination with other devices. In one embodiment, a software module is implemented with a computer program product comprising a computer-readable medium containing computer program code, which can be executed by a computer processor for performing any or all of the steps, operations, or processes described.

Embodiments of the invention may also relate to an apparatus for performing the operations herein. This apparatus may be specially constructed for the required purposes, and/or it may comprise a general-purpose computing device selectively activated or reconfigured by a computer program stored in the computer. Such a computer program may be stored in a non-transitory, tangible computer readable storage medium, or any type of media suitable for storing electronic instructions, which may be coupled to a computer system bus. Furthermore, any computing systems referred to in the specification may include a single processor or may be architectures employing multiple processor designs for increased computing capability.

Embodiments of the invention may also relate to a product that is produced by a computing process described herein. Such a product may comprise information resulting from a computing process, where the information is stored on a non-transitory, tangible computer readable storage medium and may include any embodiment of a computer program product or other data combination described herein.

Finally, the language used in the specification has been principally selected for readability and instructional purposes, and it may not have been selected to delineate or circumscribe the inventive subject matter. It is therefore intended that the scope of the invention be limited not by this detailed description, but rather by any claims that issue on an application based hereon. Accordingly, the disclosure of the embodiments of the invention is intended to be illustrative, but not limiting, of the scope of the invention, which is set forth in the following claims.

What is claimed is:

1. A method of controlling a vehicle with objects identified in an environment with simulated sensor data, comprising:

obtaining sensor data from a plurality of low-capacity sensors positioned on a vehicle in a real-world environment, wherein the low-capacity sensors are passive image sensors;

applying a machine-learning model to a synthesized input of the obtained sensor data, wherein the machine-learning model determines simulated information associated with high-capacity sensors; and adjusting a control parameter of the vehicle based on one or more objects identified, at least in part, using the simulated information.

2. The method of claim 1, wherein the simulated information is associated with a LIDAR sensor.

3. The method of claim 1, wherein the simulated information simulates measurements with respect to use of a LIDAR sensor in the real-world environment.

4. The method of claim 1, wherein the simulated information indicates, at least, depth measurements associated with the identified objects.

5. The method of claim 1, wherein the machine-learning model includes a first portion configured to receive sensor data generated by a first subset of the low-capacity sensors and generate a first output, a second portion configured to receive sensor data generated by a second subset of the low-capacity sensors and generate a second output, wherein the first subset and the second subset are image sensors with different resolution and field-of-view, and wherein the simulated information is generated by synthesizing the first output and the second output.

6. The method of claim 1, wherein the low-capacity sensors include at least two sensors having differing sensing characteristics, and wherein the simulated information is generated based on the differing sensing characteristics.

7. The method of claim 1, wherein the machine-learning model comprises output channels which output confidence scores associated with the simulated information, and wherein the confidence scores are usable by a control system of the vehicle to avoid a portion of the real-world environment or to reduce a speed of the vehicle.

8. The method of claim 1, wherein the vehicle does not have high-capacity sensors positioned on the vehicle.

9. Non-transitory computer-readable media storing instructions for execution on a processor, the instructions when executed by the processor cause the processor to:

obtain sensor data from a plurality of low-capacity sensors positioned on a vehicle in a real-world environment, wherein the low-capacity sensors are passive image sensors;

apply a machine-learning model to a synthesized input of the obtained sensor data, wherein the machine-learning model determines simulated information associated with high-capacity sensors; and adjust a control parameter of the vehicle based on one or more objects identified, at least in part, using the simulated information.

10. The computer-readable media of claim 9, wherein the simulated information is associated with a LIDAR sensor.

11. The computer-readable media of claim 9, wherein the simulated information simulates measurements with respect to use of a LIDAR sensor in the real-world environment.

12. The computer-readable media of claim 9, wherein the simulated information indicates, at least, depth measurements associated with the identified objects.

13. The computer-readable media of claim 9, wherein the machine-learning model includes a first portion configured to receive sensor data generated by a first subset of the low-capacity sensors and generate a first output, a second portion configured to receive sensor data generated by a second subset of the low-capacity sensors and generate a second output, wherein the first subset and the second subset are image sensors with different resolution and field-of-view, and wherein the simulated information is generated by synthesizing the first output and the second output.

14. The computer-readable media of claim 9, wherein the machine-learning model comprises output channels which output confidence scores associated with the simulated information, and wherein the confidence scores are usable by a control system of the vehicle to avoid a portion of the real-world environment or to reduce a speed of the vehicle.

15. A system comprising one or more processors and non-transitory computer storage media storing instructions that when executed by the one or more processors, cause the one or more processors to:

obtain sensor data from a plurality of low-capacity sensors positioned on a vehicle in a real-world environment, wherein the low-capacity sensors are passive image sensors;

apply a machine-learning model to a synthesized input of the obtained sensor data, wherein the machine-learning model determines simulated information associated with high-capacity sensors; and adjust a control parameter of the vehicle based on one or more objects identified, at least in part, using the simulated information.

16. The system of claim 15, wherein the simulated information is associated with a LIDAR sensor.

17. The system of claim 15, wherein the simulated information indicates, at least, depth measurements associated with the identified objects.

18. The system of claim 15, wherein the machine-learning model comprises output channels which output confidence scores associated with the simulated information, and wherein the confidence scores are usable by a control system of the vehicle to avoid a portion of the real-world environment or to reduce a speed of the vehicle.

* * * * *